United States Patent
Tonomura

(10) Patent No.: US 7,592,272 B2
(45) Date of Patent: Sep. 22, 2009

(54) MANUFACTURING METHOD OF SEMICONDUCTOR INTEGRATED CIRCUIT

(75) Inventor: Osamu Tonomura, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/692,620

(22) Filed: Mar. 28, 2007

(65) Prior Publication Data

US 2007/0232501 A1    Oct. 4, 2007

(30) Foreign Application Priority Data

Mar. 29, 2006    (JP)    ............................. 2006-091715

(51) Int. Cl.
 *H01L 21/26*    (2006.01)
(52) U.S. Cl. ...................... 438/783; 438/240; 438/386; 438/780; 438/E21.009
(58) Field of Classification Search ......... 438/778–784, 438/386–398, 239–256; 257/410
See application file for complete search history.

(56) References Cited

U.S. PATENT DOCUMENTS 6,297,539 B1 * 10/2001 Ma et al. .................... 257/410
6,730,164 B2 * 5/2004 Vaartstra et al. ............. 117/104
6,992,022 B2 * 1/2006 Shimamoto et al. ......... 438/780
7,053,099 B1 * 5/2006 Adams et al. ............ 514/266.3

OTHER PUBLICATIONS

"A Model for $Al_2O_3$ ALD Conformity And Deposition Rate From Oxygen Precursor Reactivity", G. Prechtl, et al.2003.

* cited by examiner

*Primary Examiner*—Dung A. Le
(74) *Attorney, Agent, or Firm*—Mattingly & Malur, P.C.

(57) ABSTRACT

An object of the present invention is to provide a method of depositing yttrium-stabilized hafnia use for a DRAM capacitor insulating film while controlling the composition at a high accuracy by an atomic layer deposition method. The atomic deposition method is performed by introducing a hafnium compound precursor, introducing a yttrium compound precursor and introducing an oxidant as one cycle. In the atomic deposition method, the addition amount of yttrium into hafnia is controlled accurately by controlling the time of introducing the hafnium compound precursor and the yttrium compound precursor and controlling the replacement ratio of OH groups on a sample surface by each of the precursors.

6 Claims, 29 Drawing Sheets

A : ((CH$_3$)$_2$CH)$_2$ CONH$_2$
D : NCH$_3$C$_2$H$_5$

CONTENT OF YTTRIA IN YTTRIUM-
STABILIZED HAFNIA (ATOMIC %)

MANUFACTURING METHOD OF SEMICONDUCTOR INTEGRATED CIRCUIT

CLAIM OF PRIORITY

The present application claims priority from Japanese application JP 2006-091715 filed on Mar. 29, 2006, the content of which is hereby incorporated by reference into this application.

BACKGROUND OF THE INVENTION

1. Field of the Invention

The present invention relates to a semiconductor integrated circuit and provides a technique of uniformly depositing an yttrium-stabilized hafnium oxide used as a highly dielectric insulating film on the surface of a sample having a structure with a high aspect ratio and a technique relating to a deposition method capable of highly accurately controlling the addition amount of yttrium. The technique concerns formation of a capacitive insulating film of a DRAM (Dynamic Random Access Memory) used as a memory for accumulating charges to record information in a capacitor and a gate insulating film of an MIS transistor.

2. Description of the Related Art

A DRAM memory cell area per bit has been reduced for higher integration density. On the other hand, capacitors, which require a predetermined capacity to avoid a read error, have been developed to have a three-dimensional capacitor structure and to reduce the thickness of a capacitor insulating film for the reduced bit areas. While various structures have been proposed for the three-dimensional capacitor structure, a trench shape is predominant at present. However, in the current processing technology, the aspect ratio is limited to about 20 to 30. The thickness of the capacitor insulating film has been reduced and the capacitance per unit area has been increased as the generations have passed. However, since silicon dioxide for the insulating film used so far has a specific dielectric constant as low as 3.9, direct tunnel leak current becomes conspicuous along with reduction of the film thickness, making it difficult to satisfy a refresh request. Accordingly, it has become essential at present to apply a highly dielectric insulating film capable of suppressing the direct tunnel leak current.

At first, a noteworthy material is tantalum pentoxide having a dielectric constant of about 50 in a crystalline state. In an MIS (Metal Insulator-Semiconductor) structure, tantalum pentoxide has been effective since a good boundary with a lower electrode polysilicon can be obtained. However, there may be a high possibility that no stability can be obtained at the boundary between tantalum pentoxide and a lower electrode titanium nitride in an MIM (Metal-Insulator-Metal) structure which is advantageous for the reduction of thickness because depletion in the lower electrode can be suppressed. This is because titanium dioxide is lower in energy than tantalum pentoxide and stable. Accordingly, tantalum pentoxide is reduced to form titanium dioxide in a case of forming a film using tantalum pentoxide on a lower titanium nitride electrode. In view of the above, an application of a different highly dielectric insulating film has been necessary.

Hafnia has a dielectric constant of about 24 which is higher than silicon dioxide. Also, hafnia gives relatively satisfactory boundary with the lower titanium nitride electrode and has high affinity with a silicon process. Furthermore, the film deposition method for hafnia has been established. Thus, hafnia has been extensively studied. With a view point of reducing the equipment investment cost or research and development cost for the material, it is desirable that the type of the material applied is not changed for a long period of time. The increase of the dielectric constant due to an addition of an element is a key to extend the applicable period of time of hafnia. At present, yttrium has been noted as an additive element for increasing the dielectric constant of hafnia. Yttrium has a smaller ionic radius compared with elements such as hafnium or O, the dielectric polarization increases due to the change of the coordination number when yttrium is added to hafnia and, as a result, the dielectric constant increases. It has also been confirmed that yttrium-stabilized hafnia can be used to reduce the film thickness compared with hafnia in capacitor evaluation. Also, products using the yttrium-stabilized hafnia are expected to be put into market. At present, a DRAM capacitor has a trench shape with an aspect ratio as high as 20 or more, and films should be deposited conformally also to such a structure. An atomic layer deposition method as a film deposition method for hafnia or the like allows for conformal film deposition and has excellent thickness controllability. However, the film deposition technique for yttrium-stabilized hafnia by the method described above has not yet been developed.

International Electron Device Meeting (IEDM) 2003, Proceeding "A Model for $Al_2O_3$ ALD Conformity and Deposition Rate from Oxygen Precursor Reactivity"

In a case of depositing a binary material such as an oxide of a specific element, for example, alumina by an atomic layer deposition method, a precursor of specific element compound and an oxidant are supplied alternately to form one atomic layer one by one on the surface. At first, a specific element precursor is supplied on a sample surface where OH groups are exposed to replace the OH groups. In this case, atomic layer deposition is attained when all the OH groups on the sample surface are replaced. For this purpose, at least the time of exposing the sample to the specific element precursor may be made sufficiently longer. Then, the oxidant is introduced to oxidize the sample surface replaced with the specific element again. In this case, it may suffice that all the groups bonded with the specific element are replaced with the OH groups. This can be attained at least by taking a sufficient time to replace the sample with the oxidant. As described above, in the existent atomic layer deposition method, since deposition is conducted by repeating the steps of completely replacing the surface of the sample with the introduced material, it may suffice to at least ensure the material introduction time sufficiently. However, in the film deposition of yttrium-stabilized hafnia, it is not sufficient to merely increase the supply of the precursor. Even when the yttrium compound precursor is introduced after introducing the hafnium compound precursor and completely replacing the OH groups, adsorption sites are not left. Thus, the replacement reaction does not proceed. Further, in a case where yttrium may be merely added to hafnia and the accuracy and the uniformity of the addition amount do not cause a problem, it may suffice to separately deposit and laminate yttrium oxide. However, since the dielectric constant of hafnia formed by adding yttrium intended for the use of the insulating film for the DRAM capacitor is changed depending on the addition amount of yttrium, it is necessary to control the addition amount of yttrium at a high accuracy in order to obtain a high dielectric constant over the entire film.

SUMMARY OF THE INVENTION

For the inventions disclosed in the present application, outline of typical embodiments are set forth as described below.

(1) A first embodiment of the present invention is described below.

A method of manufacturing a semiconductor integrated circuit device provided with a memory cell having an information storing capacitor formed above a semiconductor substrate, in which the information storing capacitor has a lower electrode, an upper electrode, and an insulating film put between them, the insulating film comprises a first element, a second element, and oxygen, the insulating film is deposited by a method of exposing a first precursor as a compound containing the first element, a second precursor as a compound containing the second element and an oxidant containing oxygen alternately to a deposition surface, and a percentage of the first precursor to be adsorbed to the adsorption site positioned on the deposition surface is 100% or less and the second precursor is adsorbed to the remaining adsorption site in the step of exposing the first precursor to the sample.

(2) The second embodiment of the invention is as described below.

A method of manufacturing a semiconductor integrated circuit device provided with a memory cell having an information storing capacitor formed above a semiconductor substrate, in which the information storing capacitor has a lower electrode, an upper electrode, and an insulating film put between them, the insulating film comprises a third element, a fourth element, and oxygen, the insulating film is deposited by combining a first cycle of exposing a third precursor as a compound containing the third element to the deposition surface and then exposing an oxidant containing oxygen to the deposition surface, and a second cycle of exposing a fourth precursor as a compound containing the fourth element to the deposition surface and then exposing the oxidant containing oxygen to the deposition surface, and substantially all the adsorption sites on the deposition surface are replaced by the third precursor by exposing the third precursor to the deposition surface, and substantially the all adsorption sites on the deposition surface are replaced by the fourth precursor by exposing the fourth precursor to the deposition surface.

(3) The third embodiment of the invention is as described below.

A method of manufacturing a semiconductor integrated circuit device provided with a memory cell having an information storing capacitor formed above a semiconductor substrate, in which the information storing capacitor has a lower electrode, an upper electrode, and an insulating film put between them, the insulating film comprises a fifth element, a sixth element, and oxygen, the insulating film is deposited by repeating a third cycle of exposing a fifth precursor as a compound containing the fifth element and a sixth precursor as a compound containing the sixth element simultaneously on the deposition surface and then exposing an oxidant containing oxygen to the deposition surface, and 100% or less of adsorption sites on the deposition surface is replaced by the fifth precursor and the remaining adsorption sites are replaced by the sixth precursor by exposing the fifth precursor and the sixth precursor to the deposition surface.

(4) The fourth embodiment of the invention is as described below.

A method of manufacturing a semiconductor integrated circuit device provided with a memory cell having an information storing capacitor formed above a semiconductor substrate, in which the information storing capacitor has a lower electrode, an upper electrode and an insulating film put between them, the insulating film comprises a seventh element, an eighth element, and oxygen, the insulating film is deposited by combining a forth deposition cycle of exposing a seventh precursor containing the seventh element to a deposition surface and then exposing an oxidant containing oxygen to the deposition surface and a fifth deposition cycle of depositing the eighth element or an eighth oxide as the oxide of the eighth element, and substantially all adsorption sites on the deposition surface are replaced by the seventh precursor by exposing the seventh precursor to the deposition surface.

A typical embodiment of the invention is to be described more specifically by using an example of depositing yttrium-stabilized hafnia by an atomic layer deposition method.

The following method is used for depositing yttrium-stabilized hafnia by the atomic layer deposition method. One cycle for conducting the atomic layer deposition includes the following 6 steps: introduction and purge of a hafnium compound precursor, introduction and purge of an yttrium compound precursor, and introduction and purge of an oxidant. The atomic layer deposition method of an oxide of a specific element described in the last paragraph of Description of the Related Art includes repetition of adsorption of a specific element precursor and oxidation thereof. Since a reaction is conducted on each of the atomic layers on the sample surface and the reaction no longer proceeds, this is an extremely simple mechanism.

On the other hand, in the deposition of yttrium-stabilized hafnia, adsorption of specific elements is conducted by using two kinds of precursors. Specifically, the most of surface OH groups is replaced with a hafnium compound precursor, and remaining OH groups are replaced with an yttrium compound precursor. Further, the yttrium addition amount is controlled by the replacement rates of the surface OH groups with the hafnium compound precursor and yttrium compound precursor. To replace a portion of hafnium in hafnia where a composition ratio of hafnium to O is 1:2 with yttrium to obtain yttrium of at % of 10%, the replacement ratio of the hafnium compound precursor to the yttrium compound precursor may be 7:3 upon replacement of the OH groups in the atomic layer deposition. Since the replacement ratio of the OH groups on the sample surface with the precursor monotonically increases with respect to the time of precursor introduction, the ratio can be controlled by the time of precursor introduction. By setting, as one cycle, a series of processes of using an optimal time of hafnium compound precursor introduction, replacing all remaining OH groups with an yttrium compound precursor, and successively oxidizing them with an oxidant, it is possible to attain the atomic layer deposition of hafnia in which the yttrium doping amount is accurately controlled to 10%.

Details of practicing methods will become apparent with reference to the embodiments.

According to an aspect of the present invention, an insulating film having a uniformly high dielectric constant on its surface can be provided. Therefore, the insulating film is particularly useful for use in information storing capacitor.

Further, effects obtained by typical embodiments of the invention disclosed by the present application are simply described as below. Particularly, in semiconductor integrated circuit devices using DRAM having, for example, a high density integrated memory circuit, a logic hybrid memory in which a memory circuit and a logic circuit are disposed on one identical semiconductor substrate, and an analog circuit, reduction of consumption power, increase in the capacity and increase in the operation speed can be attained.

A method of manufacturing an insulating film according to the present invention can be applied for use in various kinds of insulating films. Most typically, it is used for the manufacture of information storing capacitors of a semiconductor memory device.

A basic constitution of the semiconductor memory device includes a plurality of word lines, a plurality of bit lines, formed above a semiconductor substrate, memory selecting transistors disposed at predetermined intersections between the plural word lines and the plural bit lines, and a memory cell comprising information storing capacitor electrically connected serially with memory cell selecting transistors and formed above the semiconductor substrate. The invention is sufficiently applicable to 65 nm node or later generation.

BRIEF DESCRIPTION OF THE DRAWINGS

Preferred embodiments of the present invention will be described in details with reference to the drawings, wherein.

DETAILED DESCRIPTION OF THE PREFERRED EMBODIMENTS

First Embodiment

In a first embodiment, a method of depositing yttrium-stabilized hafnia is described. The method is performed by an atomic layer deposition method and a method of controlling an yttrium addition amount to 10% at a good controllability.

Figure 1:
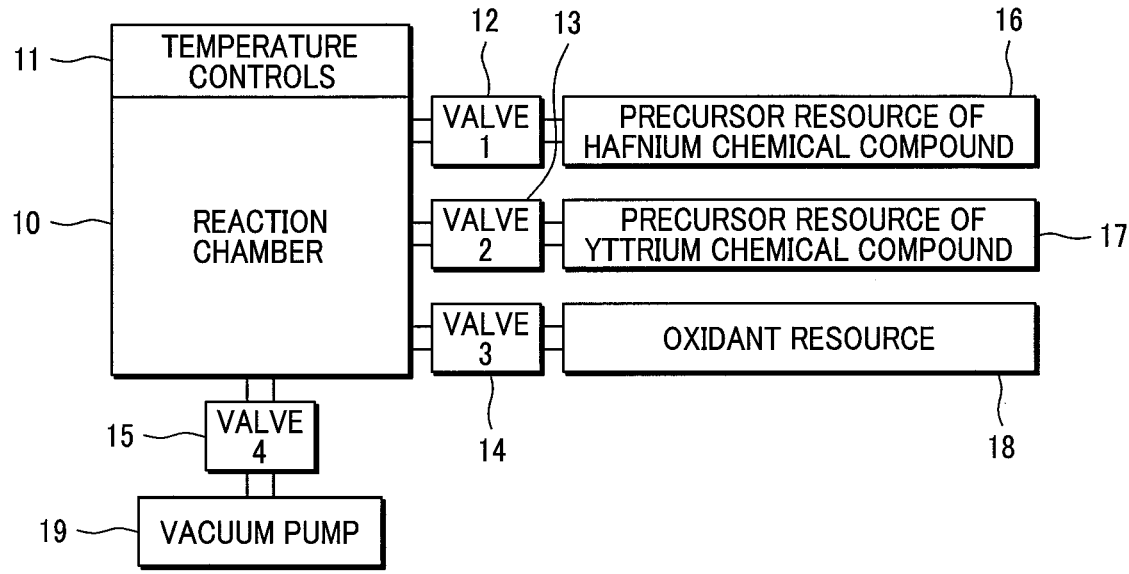
FIG. 1 is a constitutional view of an apparatus necessary to achieve a deposition method according to the present invention.

At first, the constitution of an apparatus necessary for conducting the film deposition is to be described with reference to FIG. 1. The apparatus for conducting deposition has a reaction chamber 10 capable of controlling internal pressure and temperature. Further, the reaction chamber can be controlled at temperatures from 200° C. to 500° C. at which the atomic layer deposition is possible. Reference numeral 11 denotes a temperature control device. The reaction chamber 10 is connected to a precursor resource of hafnium compound 16, a precursor resource of yttrium compound 17, an oxidant resource 18, and a purging mechanism such as a pump 19 capable of purging each of precursors and impurity gases introduced in the reaction chamber 10. Further, between the introduction mechanisms and the purging mechanism for respective precursors, and the reaction chamber, there are interposed valves (12, 13, 14, and 15) capable of controlling the introduction and stop of the introduction, and start and stop of purge of the precursors at a high time resolution power. The valves can be operated in an interlocking manner. For example, it is possible to open the valve for introducing the hafnium compound precursor, to fill the inside of the chamber with the hafnium compound precursor and then close the valve to stop introduction of hafnium compound precursor and, at the same time, open the valve in communication with the purging mechanism to rapidly purge the hafnium compound precursor in the reaction chamber. As a result, the time in which the sample in the reaction chamber is exposed to the hafnium compound precursor can be controlled accurately. In the same manner, other precursors can also be exposed at a high time resolution power and, for example, a series of film deposition steps such as introduction and purge of the hafnium compound precursor, introduction and purge of the yttrium compound precursor and introduction and purge of the oxidant can be conducted in an interlocked manner.

Then, the principle of deposition by the atomic layer deposition method and the control method for the composition of three kinds of elements contained in yttrium-stabilized hafnia are disclosed. Prior to the description, an optimal deposition process will be disclosed. The optimal deposition process was obtained based on the principle of deposition performed by the atomic layer deposition method (which has been already established) using two kinds of precursors, and on analysis results. Then, the knowledge concerning the optimal film deposition process obtained here is extended to describe the principle of deposition by the atomic layer deposition method using three kinds of precursors and the control method for the composition of the three kinds of elements.

Figure 2:
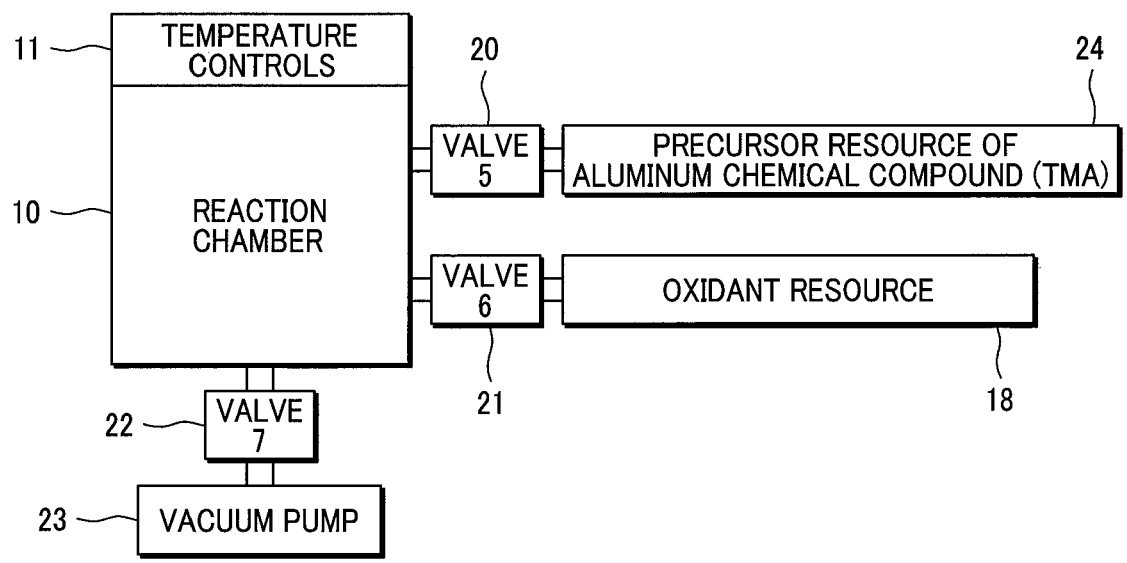
FIG. 2 is a constitutional view of an apparatus necessary for deposition by an atomic layer deposition method.
Figure 3:
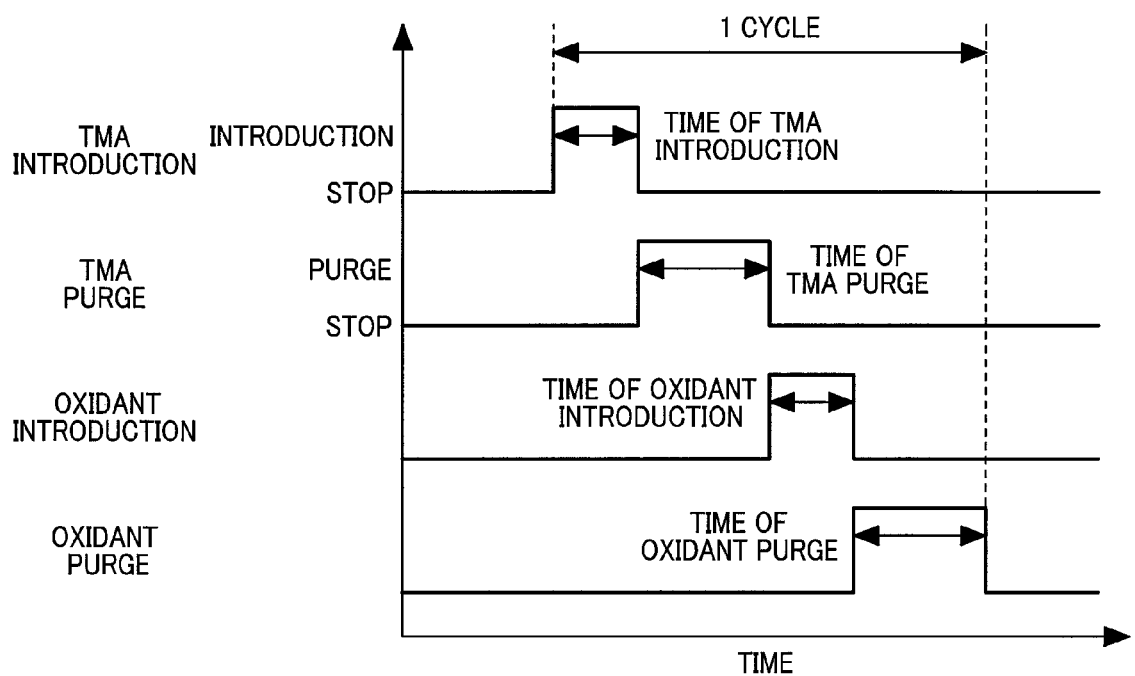
FIG. 3 is a timing chart upon depositing by the atomic layer deposition method.

At first, an optimal deposition process obtained from the principle of deposition according to the atomic layer deposition method using two kinds of precursors and the result of analysis is disclosed. Especially a description is made of, as an example, a deposition of alumina ($Al_2O_3$) using trimethyl aluminum ($Al(CH_3)_3$: hereinafter referred to as TMA) and water ($H_2O$) as the starting materials. FIG. 2 shows the constitution of an apparatus used to perform the deposition. This is different from the constitution of the apparatus for depositing yttrium-stabilized hafnia in that two precursor resources (24, 18) and two valves (20, 21) are provided. Reference numeral 22 denotes a valve for a vacuum pump. This includes a resource for aluminum compound precursor (TMA) and a valve therefor, and an oxidant (water or ozone) resource and a valve therefor. FIG. 3 shows a timing chart for depositing alumina to a sample in the reaction chambers using the apparatus. The alumina deposition step is divided into four steps. The steps are TMA introduction, TMA purge, oxidant introduction and oxidant purge, respectively. Alumina can be deposited by repeating plural cycles with the 4 steps being as one cycle.

Figure 4:
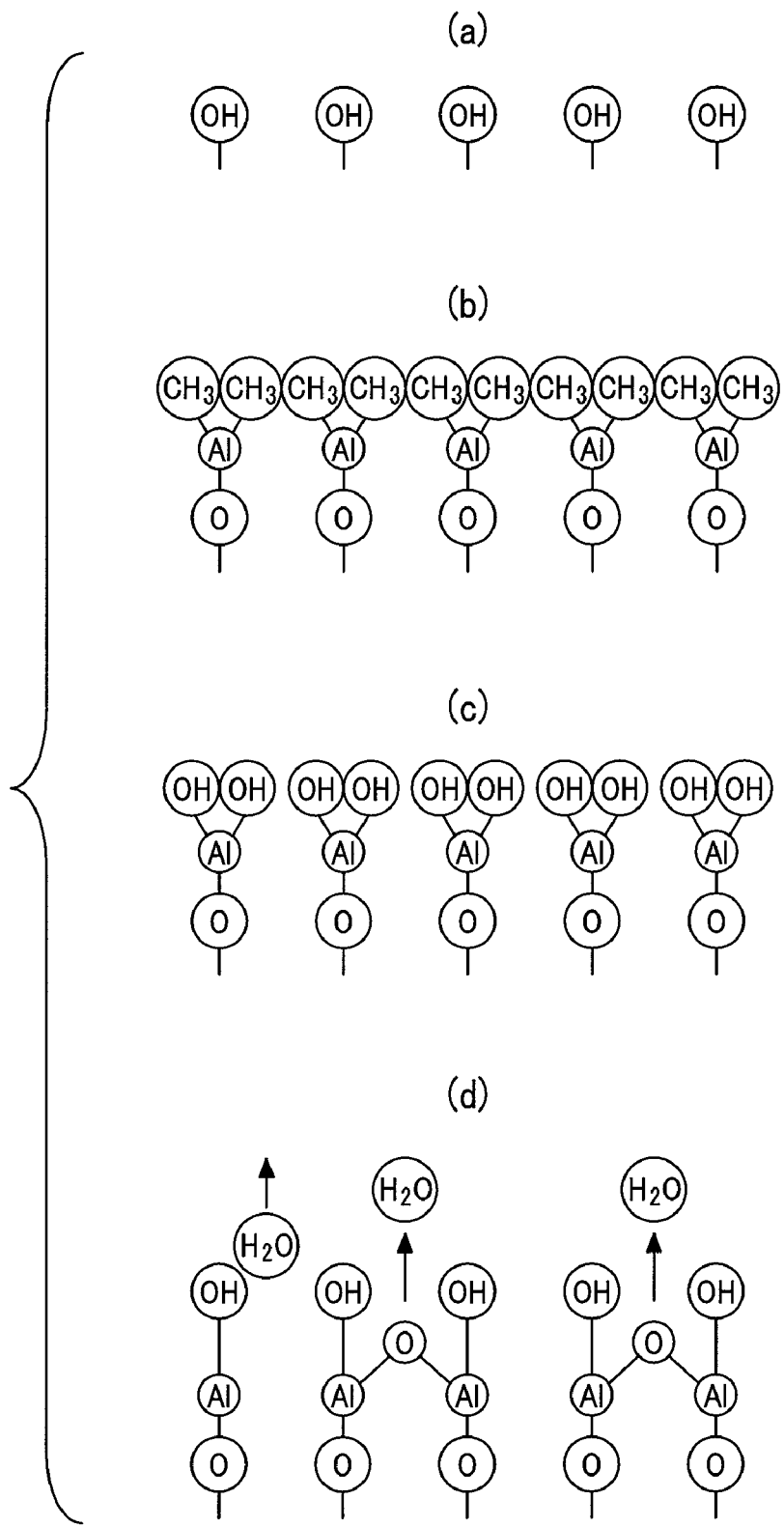
FIG. 4 is a model view for the arrangement of atoms on a sample surface upon deposition of alumina by an atomic layer deposition method.

FIG. 4 schematically shows reactions occurring on the sample surface in each of the steps. At first, when TMA is introduced to a sample (a) where OH groups are exposed on the surface, hydrogen of the OH group is bonded to aluminum of TMA (b). Then, in the purging step of TMA, TMA not contributing to the reaction at the sample surface but remaining in the reaction chamber and methyl or the like as reaction by-products are purged. Successively, by the introduction of an oxidant, a methyl group bonded with aluminum exposed to the surface is replaced with OH (c). Finally, in the purging step of the oxidant, water not contributing to the reaction at the sample surface and water as by-products upon forming aluminum-oxygen-aluminum bond, etc. are purged.

The deposition method has a feature in that the controllability of the film thickness is extremely high since the reaction is surface-atom layer reaction in each of the steps. While this deposition method is a method suitable for the deposition of a capacitor insulating film for DRAM, it is required for alumina for which high insulation property is necessary that the compositional ratio conform the stoichiometrical ratio at a high accuracy. In the composition control for alumina, control for the surface reaction in each of the steps during deposition is important. For example, in a case of using water as the oxidant, when replacement of the methyl group to the OH group is insufficient, methyl remains in the alumina film. Further, in the methyl group where water is not adsorbed but remains in the water introduction step, TMA introduced subsequently is not absorbed to cause voids. On the other hand, when water is supplied continuously even after completion of replacement of the methyl group to the OH group, water adsorbs physically on the surface. The water cannot be removed completely in the next purging step of the oxidant and possibly remains as an impurity in alumina. Further, it may possibly react with TMA introduced in the next step to form an impurity. Accordingly, for the control of the alumina composition, it is necessary to control at least the oxidant introduction step. While it is considered that there are a plurality of factors of controlling the surface reaction of the oxidant, the time of oxidant introduction has the most significant factor and can be controlled easily. When water is introduced to the sample surface where methyl groups bonded with aluminum are exposed, replacement of the methyl group to the OH group proceeds with time, and when introduction of water is stopped at the instance where all the methyl groups are replaced by the OH groups and water is purged, it is possible to deposit alumina with a composition nearer to the stoichiometrical ratio.

An example of optimizing the condition of alumina deposition in a case of using water for the oxidant based on the concept is to be shown and a knowledge necessary for considering the method of controlling the composition of yttrium-stabilized hafnia is disclosed.

Figure 5:
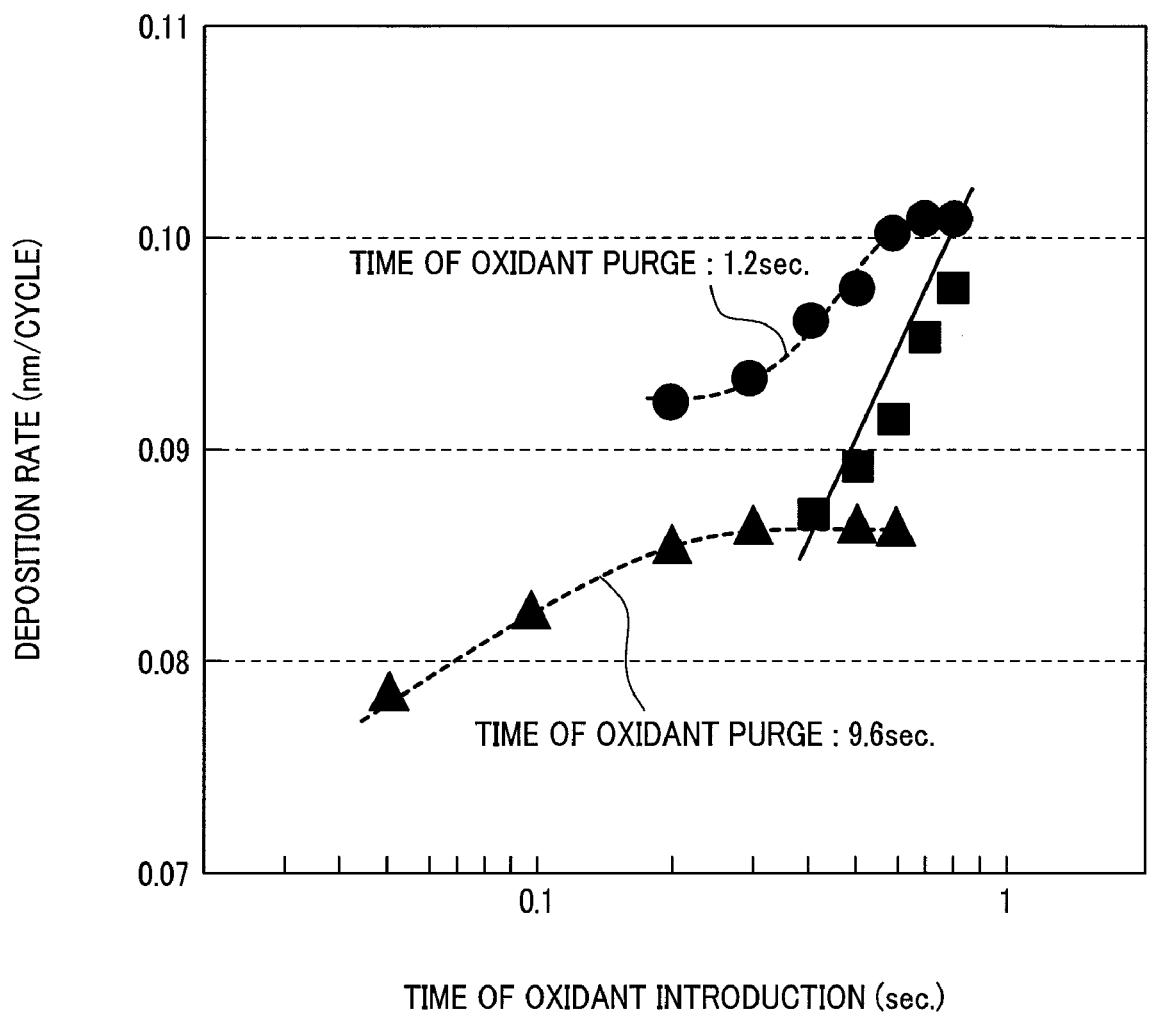
FIG. 5 is a graph showing the dependence of an alumina deposition rate on the time of water introduction.

FIG. 5 is an example of the result of experiment, showing the change of a deposition rate when the time of water introduction is changed. The result is shown for cases where the water purging time is 1.2 sec and 9.6 sec, and both of the cases provide a result that the deposition rate of alumina increases along with increase in the time of water introduction and then the alumina is saturated finally. It is considered that the increase of the deposition rate along with increase in the time of water introduction corresponds to the increase in the replacement ratio of the methyl groups bonded with aluminum to the OH groups. In a case where replacement to the OH group is insufficient, since no sufficient reaction with TMA to be introduced next can be conducted sufficiently, the deposition rate is lowered. On the other hand, in a case where the replacement ratio to the OH groups increases to 100%, the deposition rate increases and is then saturated to the maximum. That is, it is considered that the time of water introduction at which the deposition ratio is maximum is an optimal deposition condition for the deposition of alumina with a stoichiometrical composition.

Figure 6:
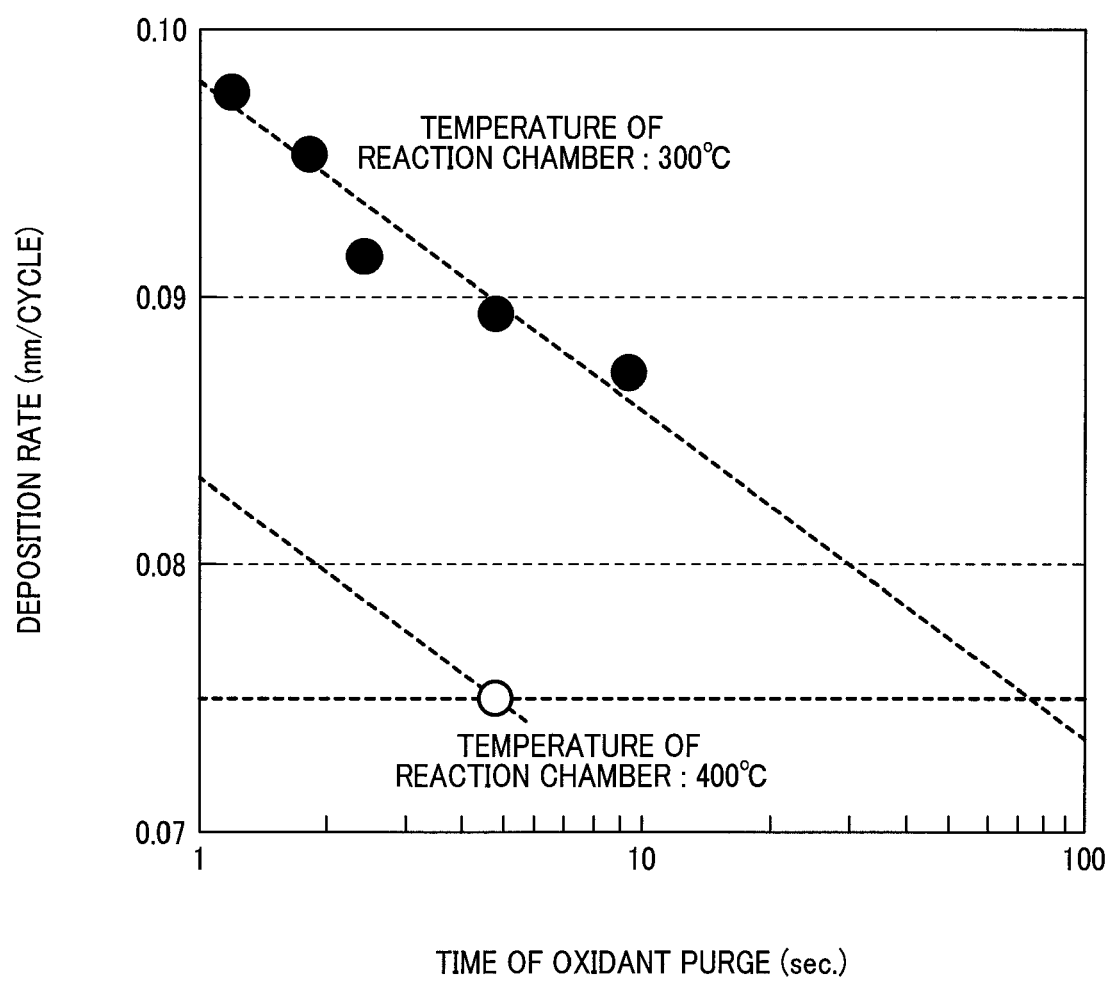
FIG. 6 is a graph showing the dependence of an alumina deposition rate on the time of water purge.

Then, the result of study on the optimal time of water purge is disclosed. FIG. 6 shows the change of the alumina deposition rate when the time of water purge is changed. Along with increase in the time of water purge, the alumina deposition rate decreases. The water purge step is a step of purging water remaining as an impurity in the reaction chamber as described with reference to FIG. 4. It is considered that as the time of water purge increases, removal of water present as a gas in the chamber or physically adsorbing to the sample surface proceeds to lower the deposition rate. Since the impurity in alumina is attributable to deviate the alumina composition from the stoichiometrical ratio, it is desirable to remove the impurity as much as possible. That is, it is considered important to ensure a sufficiently long time for water purge upon deposition of alumina by the atomic layer deposition method.

However, since a high throughput is required for the manufacture of products, it is not advantageous to make the deposition time longer with no restriction. Then, as another method of removing water as the impurity, it may be considered a method of increasing the temperature of the reaction chamber during deposition. When the temperature of the reaction chamber is increased the possibility of adsorbing water to the sample surface during deposition decreases making it possible for more efficient water purge. FIG. 6 describes the deposition rate in a case of increasing the deposition temperature from 300° C. to 400° C. The deposition rate of 80 sec is required at a temperature of 300° C. while the deposition rate of 4 sec is required at a temperature of 400° C. While the lowering of the deposition rate is caused by the lowering of adsorption possibility of TMA and other factors, physical adsorption of impurity can be decreased, and increase of the reaction chamber temperature can shorten the time in each of the steps.

Figure 7:
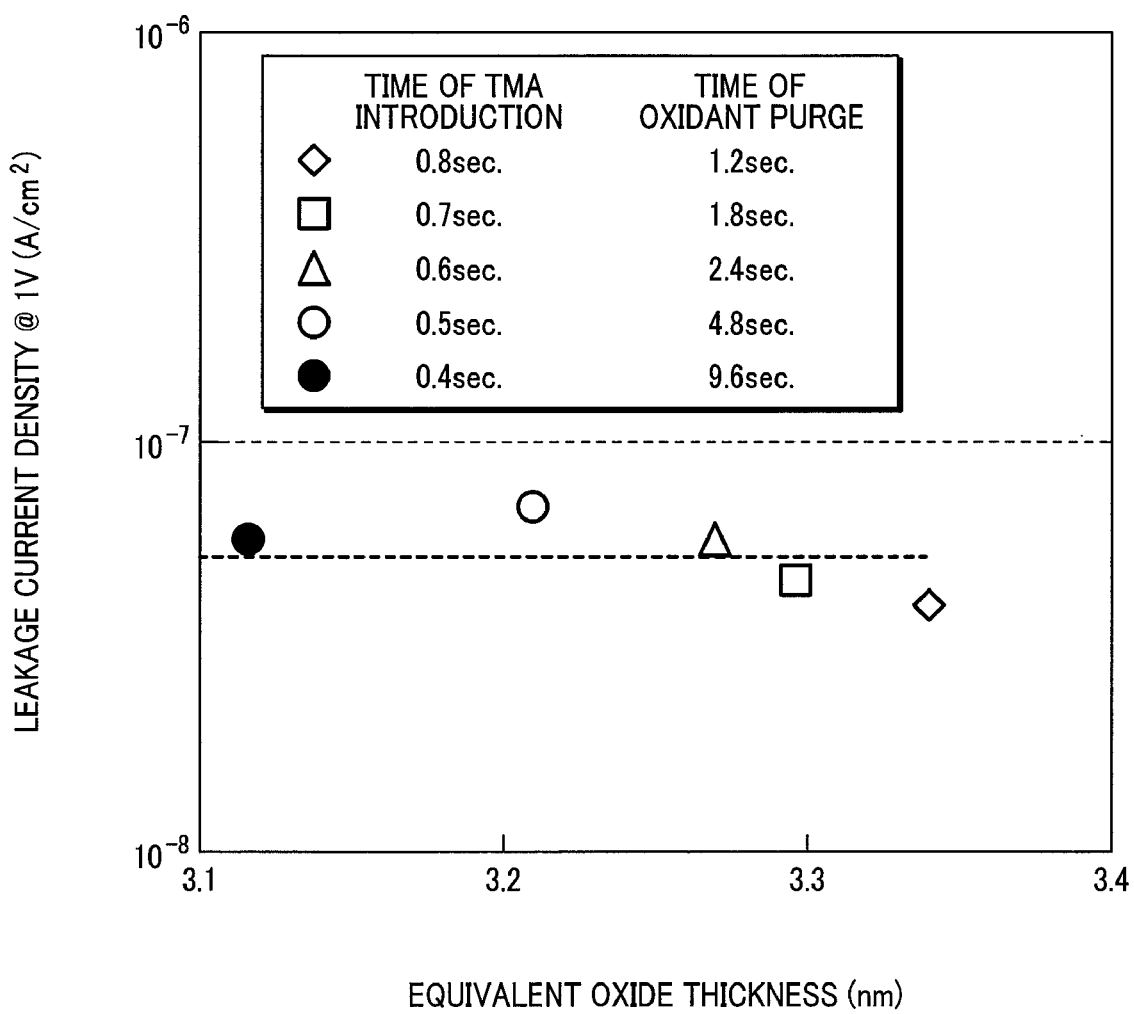
FIG. 7 is a graph showing the dependence of thickness-leak current density on deposition condition.

Finally, based on the study described above, a capacitor formed of alumina deposited under optimal conditions provides a lower leak current at a reduced thickness. This result will be described. When the time of water introduction is increased for each of time of water purge (1.2 sec, 9.6 sec) in FIG. 5, the time of water introduction where the alumina deposition rate is increased and the alumina is saturated is derived and a curve connecting the points is shown by a solid line. It is considered that points on the solid line have an optimal time of water introduction, and a capacitor was experimentally manufactured as an insulating film using alumina deposited under five conditions in which the time of water purge varies on the curve. FIG. 7 shows the result of evaluation for electric characteristics. Titanium nitride was used for the upper electrode and phosphorus-doped polysilicon was used for the lower electrode. The abscissa shows an equivalent oxide thickness estimated by using the dielectric constant of silicon oxide based on the capacitance value determined by measurement upon applying a voltage of 1 V to the upper electrode. The ordinate shows a current value upon applying a voltage of 1 V to the upper electrode. When the time of water purge is increased, while the leak current value takes a substantially identical value, the equivalent oxide thickness is reduced gradually. That is, reduction of the thickness was succeeded by the increase in the time of water purge. This is considered to be attributable to the increase in the insulative property of alumina and suggests that the optimization for the deposition condition was appropriate.

While the method of optimizing the step of water introduction and water purge has been described above, optimization for the step of TMA introduction and TMA purge can also be conducted in the same manner. Further, in a case of using ozone as the oxidant, since the adsorption coefficient is smaller compared with that of water, more conformal deposition is possible. On the other hand, the optimal time of ozone introduction is longer compared with water. However, the method of deriving the optimal deposition condition is identical with that in the case of using water for the oxidant.

The deposition method shown here is referred to as an atomic layer deposition method and the composition can be controlled by controlling the deposition condition as shown above. By applying the knowledge, a method of depositing yttrium-stabilized hafnia and a method of controlling the composition are to be described below.

Figure 8:
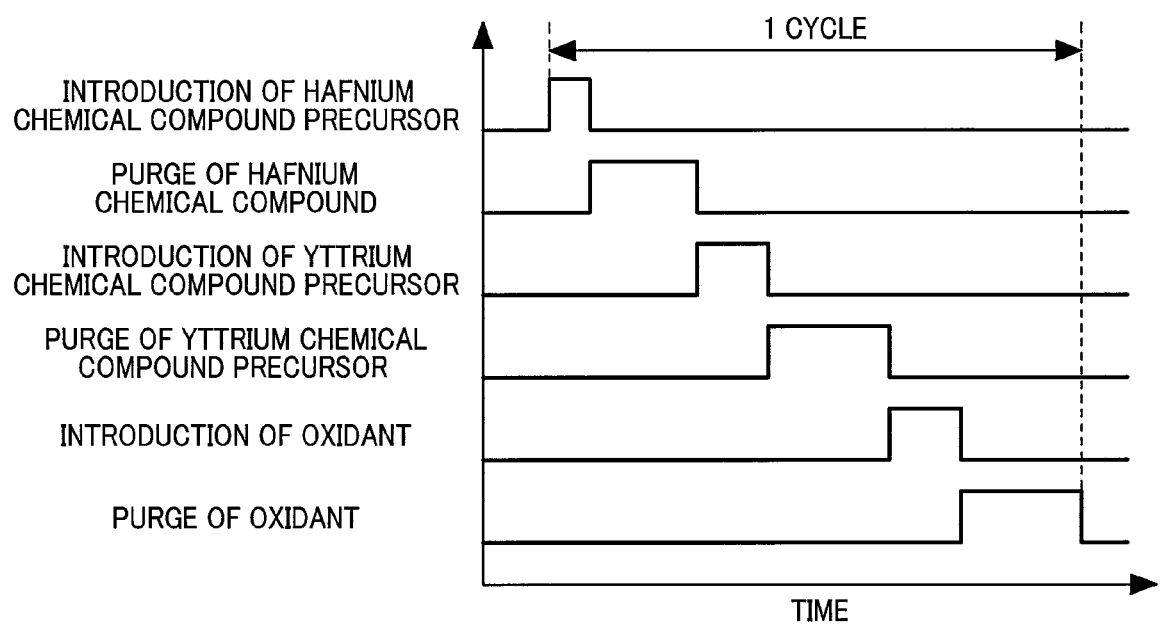
FIG. 8 is a timing chart upon deposition of yttrium-stabilized hafnia.

In the deposition of yttrium-stabilized hafnia, one cycle is divided into six steps. FIG. 8 shows the timing chart. At first, introduction and purge of a hafnium compound precursor are conducted and then introduction and purge of an yttrium compound precursor and, finally, introduction and purge of an oxidant are conducted. The introduction and purge of respective precursors may be collected and the sequence thereof may be reversed. At first, the hafnium compound precursor is introduced. The hafnium compound precursor includes, for example, hafnium chloride ($HfCl_4$), hafnium tert butoxide ($Hf[OC(CH_3)_3]_4$), tetrakis diethylamide hafnium ($Hf[N(CH_3)_2]_4$), tetrakis dimethylamide hafnium ($Hf[N(C_2H_5)_2]_4$), and tetrakis ethyl methyl amide hafnium ($Hf[N(CH_3)(C_2H_5)]_4$, hereinafter referred to as TEMAH). Successively, the hafnium compound precursor is purged. Then, the yttrium compound precursor is introduced. The yttrium compound precursor includes, for example, yttrium tridiisopropyl acetoamidate ($Y[((CH_3)_2CH)_2CONH_2]_3$), tri bis trimethyl silyl amide yttrium ($[[(CH_3)_3Si]_2N]_3Y$), and YBaCuOx. Successively, the yttrium compound precursor is purged. Finally, the oxidant is introduced and purged. The oxidant includes ozone, water, hydrogen peroxide, etc.

Figure 9:
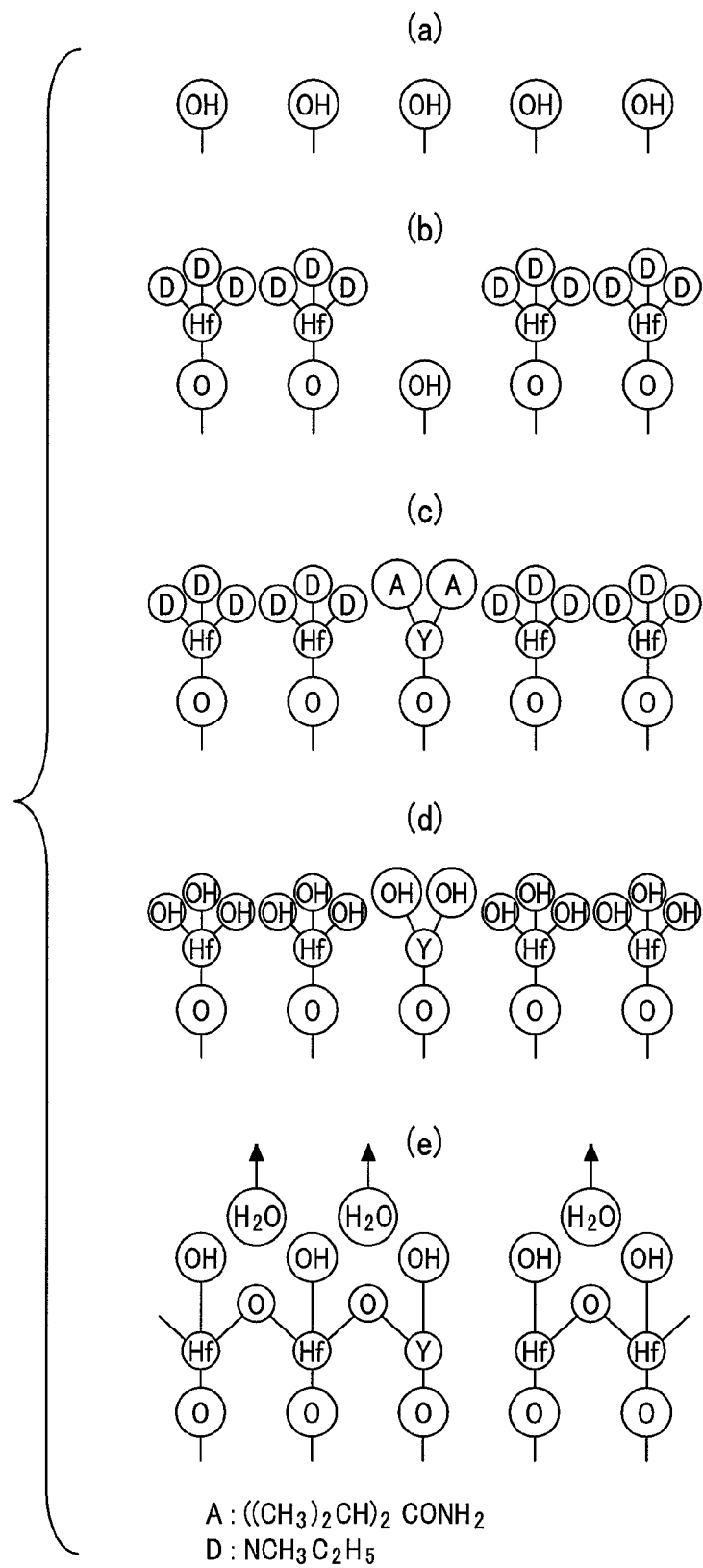
FIG. 9 is a model view for the arrangement of atoms on a sample surface upon deposition of yttrium-stabilized hafnia.

Then, the reaction at the sample surface and the controlling method for the yttrium addition amount upon depositing yttrium-stabilized hafnia by the atomic layer deposition method are to be described. Upon depositing alumina by the atomic layer deposition method, a process of adsorbing a specific element (Al) and oxygen each by one layer on the sample surface is repeated. The principle is basically identical for the yttrium-stabilized hafnia. This is different in that adsorption of the specific element is divided into two steps. As shown in FIG. 9, the hafnium compound precursor is at first adsorbed to a most portion of surface OH groups, and the yttrium compound precursor is adsorbed to remaining OH groups. The yttrium addition can be controlled accurately in a case where the rate of replacement of the OH groups with the hafnium compound precursor on the sample surface can be controlled accurately. In a case where such control is possible, it is then exposed to the yttrium compound precursor till the replacement is completed on the sample surface to attain a composition of the sample surface with a predetermined ratio of yttrium to hafnium. Successively, the oxidant is introduced to replace, to OH groups, substantially all the groups bonded with yttria and hafnium in the yttrium compound and the hafnium compound adsorbed to the sample surface. When the deposition cycle is repeated plural times, it is possible to deposit yttrium-stabilized hafnia, in which the yttrium addition amount is controlled with high accuracy.

Figure 10:
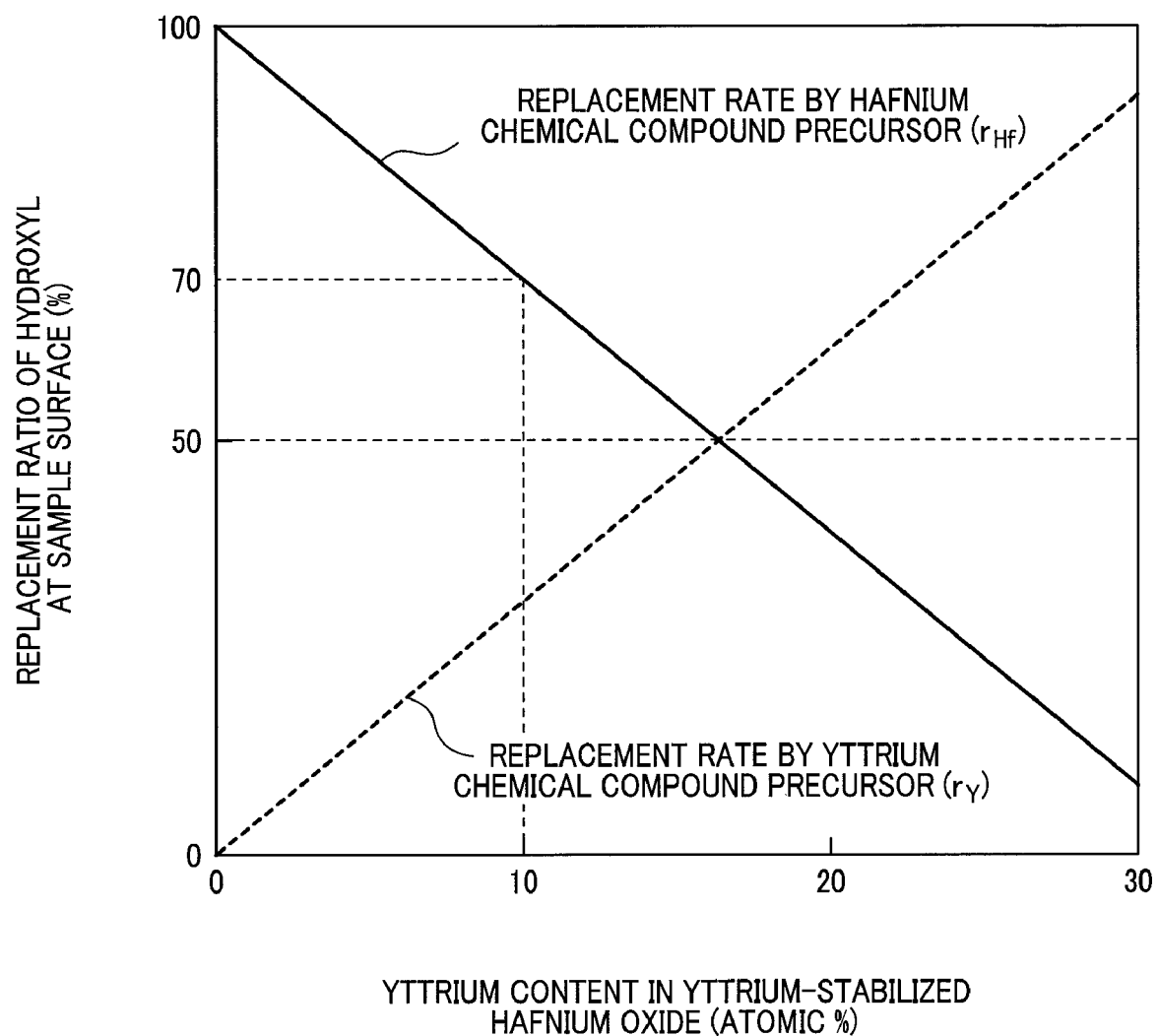
FIG. 10 is a graph showing a replacement ratio of OH groups on a sample surface by a hafnium compound precursor and an yttrium compound precursor for obtaining a desired yttrium addition amount.

Then, a method of adding, particularly, 10% yttrium to hafnium is to be shown. In the stoichimetric composition of hafnia, the ratio of the number of hafnium atoms to the number of oxygen atoms is 1:2, and it is considered that a portion of hafnium is replaced with yttrium in a case of adding yttrium at about 10% thereto. Under such a concept, in a case of adding at 10% by at % as shown in FIG. 10, it may suffice that the ratio for the number of yttrium, hafnium and oxygen atoms is about 3:7:20. That is, since the ratio for the number of hafnium and yttrium atoms is 7:3, in the deposition process, the replacement ratio of the OH groups on the sample by the hafnium compound precursor may be set to 70% and the remaining 30% may be replaced with the yttrium compound precursor.

Then, using the model chart for the arrangement of atoms and molecules on the sample surface, the surface reaction upon depositing the yttrium-stabilized hafnia by the atomic layer deposition method using three kinds of materials, i.e., TEMAH, yttrium tri diisopropyl acetoamidate and water. At first, the sample surface where the OH groups are exposed is exposed to TEMAH as the hafnium compound precursor. Then, hydrogen in the OH group is replaced with TEMAH in which one of ethyl-methyl-amide groups is decomposed, and chemical adsorption of TEMAH to the sample surface is started. The replacement ratio of the OH groups present on the sample surface to TEMAH is defined as a TEMAH replacement ratio, in which the state where the TEMAH is not replaced is defined as 0%, and the state where all the OH groups are replaced by TEMAH is defined as 100%. From the start of TEMAH introduction, the TEMAH replacement ratio starts to increase along with time from 0% and the increase stops simultaneously with TEMAH purging. The relation between the time of TEMAH introduction and the TEMAH replacement ratio may be considered to be qualitatively identical with the relation between the time of water introduction and the deposition rate, that is, the replacement ratio to the OH groups as described above for the mechanism of alumina deposition through the absolute value differs when the sticking coefficient or the deposition condition of the precursor are different. That is, the replacement ratio of the OH groups on the sample surface to TEMAH can be controlled by the time of TEMAH introduction.

Figure 11:
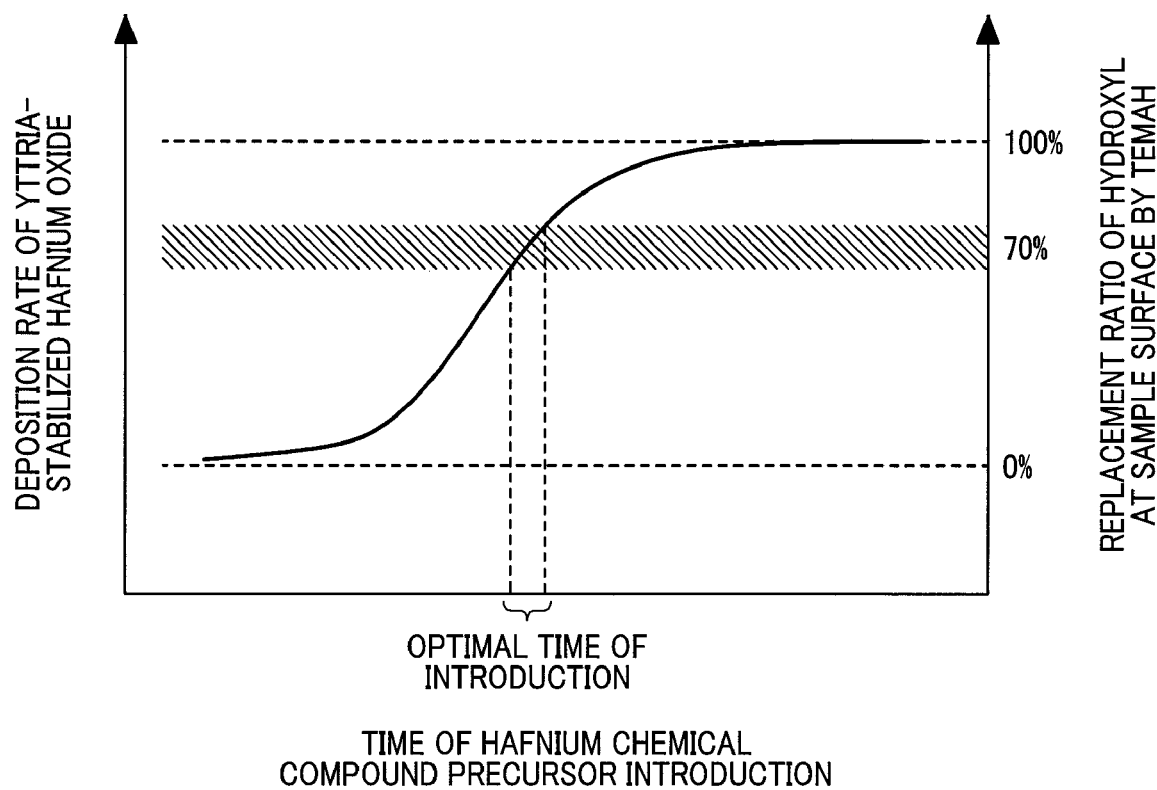
FIG. 11 is a graph showing the optimal time of introduction of a hafnium compound precursor for controlling the yttrium addition amount to 10%.

Then, a method of determining the time of TEMAH introduction for controlling the yttrium addition amount to 10% at a high accuracy is described. FIG. 11 shows the dependence of the deposition rate on yttrium-stabilized hafnia on the time of TEMAH introduction. The deposition rate of yttrium-stabilized hafnia increases along with increase of the time of TEMAH introduction. However, the increasing rate of the deposition rate is gradually lowered and then TEMAH is saturated. Since the change of such deposition rate corresponds to the replacement ratio of the OH groups on the sample surface to TEMAH, the ordinate can be replaced as described below. Using the ordinate of the graph as a second axis, the replacement ratio of the OH groups on the sample surface to TEMAH is shown on the right of the graph. The deposition rate of yttrium-stabilized hafnia in a case where the time of TEMAH introduction is sufficiently short corresponds to 0% replacement ratio to TEMAH, and the value when the time of TEMAH introduction is sufficiently long and the deposition rate of yttrium-stabilized hafnia is saturated corresponds to 100% replacement ratio to TEMAH. In a case of controlling the yttrium addition amount of yttrium-stabilized hafnia to 10%, this can be attained by controlling the replacement ratio of the OH groups on the sample surface to TEMAH to 70% as described previously. For this purpose, the time of TEMAH introduction may be set to a value so that the replacement ratio of the OH groups on the sample surface to TEMAH is controlled to 70% in view of the graph shown in FIG. 11. However, in a case where it is difficult to completely control the ratio to 70%, the time of hafnium compound precursor introduction may be decided while providing a margin of about ± several percent.

Figure 12:
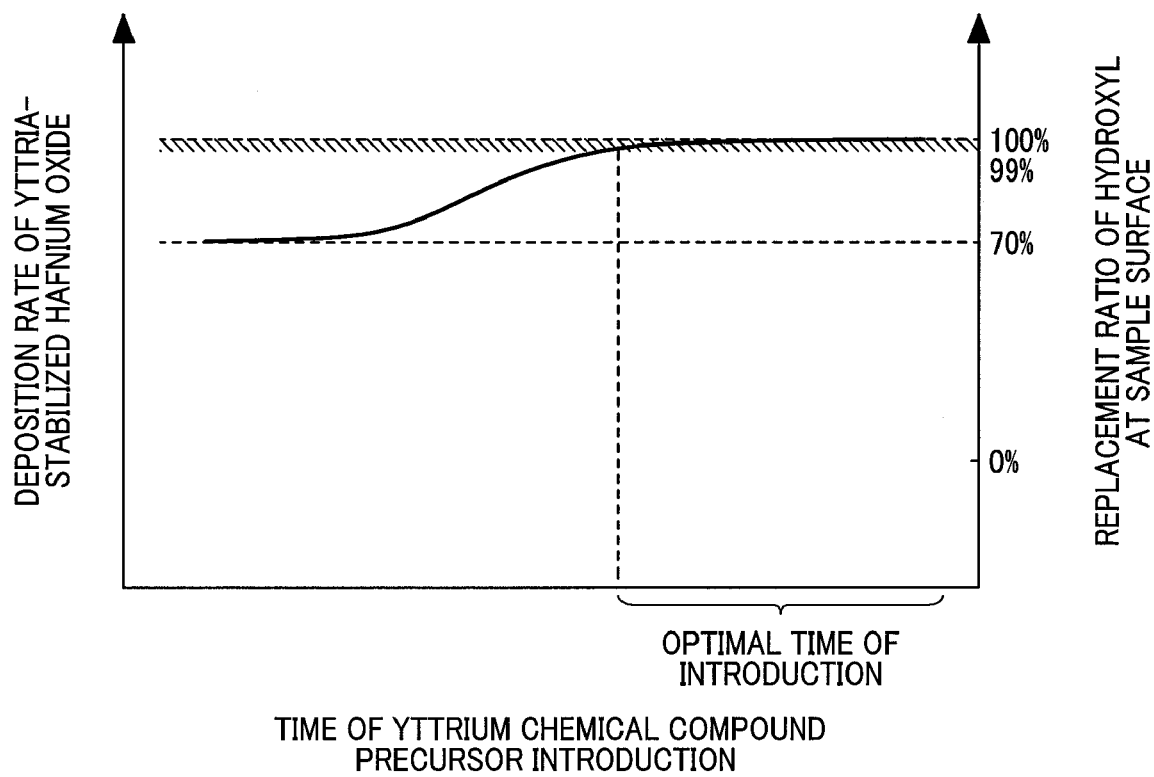
FIG. 12 is a graph showing the optimal time of introduction of a yttrium compound precursor for controlling the yttrium addition amount to 10%.

Then, a description will be made of a method of determining the time of yttrium compound precursor introduction after replacing 70% of the OH groups on the sample surface by TEMAH as the hafnium compound precursor and purging TEMAH. FIG. 12 shows the dependence of the deposition rate of yttrium-stabilized hafnia on the time of yttrium compound precursor introduction. The deposition rate of yttrium-stabilized hafnia can be replaced with the replacement ratio of the OH groups on the sample surface with the same reasons as those for the description with reference to FIG. 11. At present, since 70% of the OH groups on the sample surface is replaced to TEMAH, the replacement ratio of the OH groups on the sample surface is 70% in a case where the time of the yttrium compound precursor introduction is sufficiently short. When the time of yttrium compound precursor introduction is increased by the mechanism identical with that in FIG. 11, the replacement ratio of the OH groups on the sample surface is increased and then saturated at 100%. In a case of replacing the OH groups on the sample surface for 70% by the hafnium compound precursor and for 30% by the yttrium compound precursor, since the addition amount of yttrium to hafnia reaches 10% as an aimed value, the time at which the replacement ratio of the OH groups on the sample surface reaches 100% is ideal for the introduction of the yttrium compound precursor. For this purpose, at least the time of yttria compound introduction may be ensured sufficiently long. However, in a case where the time of yttrium compound precursor introduction is excessively long, the yttrium compound precursor not reacting with the OH groups on the sample surface is supplied excessively and, as a result, impurities are deposited on the sample surface or in the reaction chamber. Since it takes much time for removing the impurities in the subsequent purging step of the yttrium compound precursor, this lowers the throughput. Also in a case where they are not removed sufficiently, they react with the oxidant introduced in the subsequent step to possibly form by-products as additional impurities. In a case where the yttrium compound precursor is introduced till the replacement ratio of the OH groups on the sample surface completely reaches 100% and the time of the precursor introduction becomes extremely long to cause a possibility of forming the impurities, it may be considered that a time of the yttrium compound precursor introduction which provides 99% or more of the replacement ratio for the OH groups on the sample surface may suffice.

Figure 13:
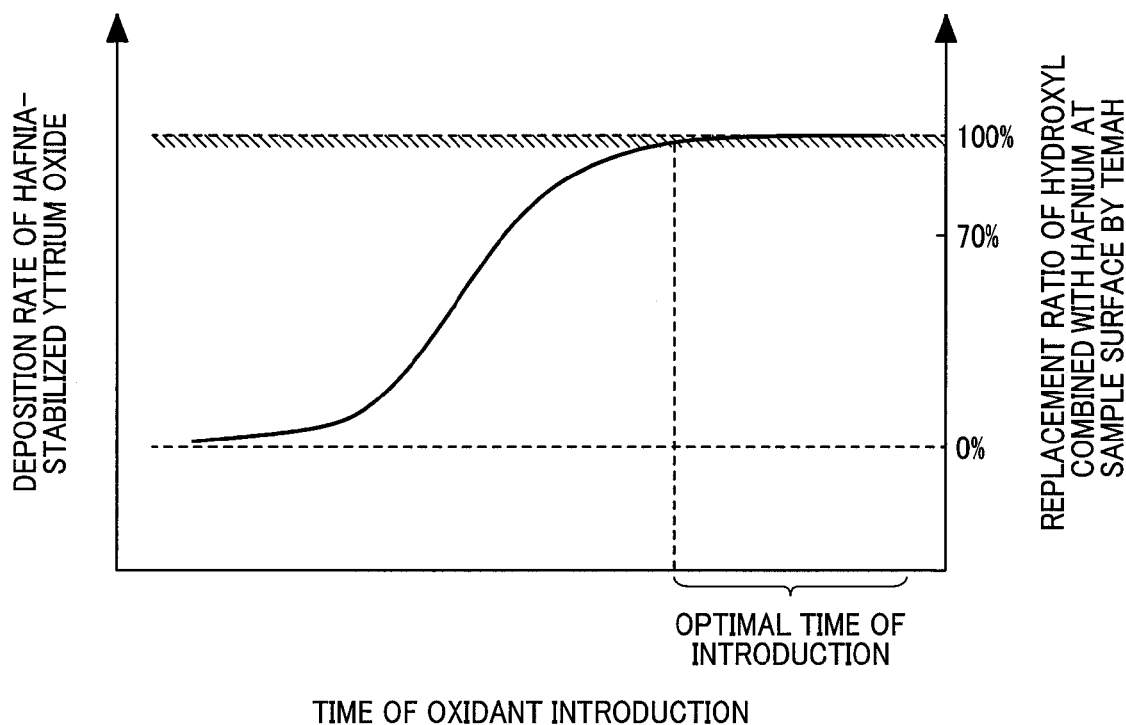
FIG. 13 is a graph showing an optimal time of introduction of an oxidant.

Finally, the oxidant is introduced. As shown in FIG. 13, the hafnium compound precursor and the yttrium compound precursor exposed to the sample surface are replaced and, as the replacement ratio is larger, defects or voids are reduced to form a film approximate to a stoichiometrical composition. However, in a case where the time of oxidant introduction is increased excessively for sufficiently bringing the replacement ratio to 100%, this results in a problem of lowering the throughput. Then, a time of oxidant introduction by which the replacement ratio of the hafnium compound precursor and the yttrium compound precursor on the sample surface is 99% or more is defined as an optimal introduction time.

The advantage of this deposition method is that deposition of a uniform composition just after deposition is possible since hafnium and yttrium are deposited each at a predetermined ratio in each of the layers. However, since it is necessary to control the replacement ratio of the OH groups on the sample surface by the hafnium precursor and the yttrium compound precursor by the time of precursor introduction, it is required for sufficient conditioning and control for the time of introduction and purge for each of the precursors at a high accuracy.

By the method described above, yttrium-stabilized hafnia can be deposited by the atomic layer deposition method with a good controllability for the yttrium addition amount. Further, the atomic layer deposition method for the ternary material described above is applicable also to the materials other than yttrium-stabilized hafnia. For example, this is applicable also to deposition of materials in which a material such as hafnium, aluminum, yttrium, zirconium, lanthanum, niobium, tantalum, titanium, scandium, or silicon is added to hafnia, alumina, yttria, zirconia, lanthanum trioxide, niobium pentoxide, tantalum pentoxide, titanium dioxide, scandium trioxide, or silicon dioxide.

Figure 14:
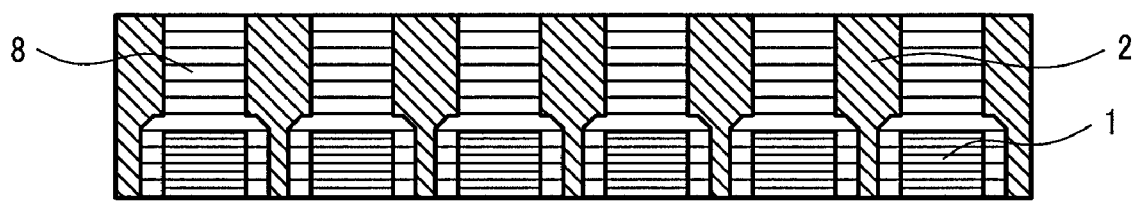
FIG. 14 is a cross sectional view showing a portion in the vicinity of a DRAM memory cell.

Successively, a method of manufacturing a DRAM memory capacitor having a capacitor according to the invention is to be disclosed. As shown in the cross sectional view of FIG. 14, a bit line 1 is formed above a memory cell selecting transistor formed by a known method, and a polysilicon plug 2 for electrical connection between the selecting transistor and the capacitor is formed. In the drawing, reference numeral 8 denotes an insulator layer. Since, various kinds of usual constitutions can be used for the constitution per se of a semiconductor integrated circuit disposed below the constitution shown in FIG. 14 and FIG. 15, it is not illustrated, but only the portions having direct concern with the invention are shown. This is also identical from FIGS. 16 to 22.

Figure 15:
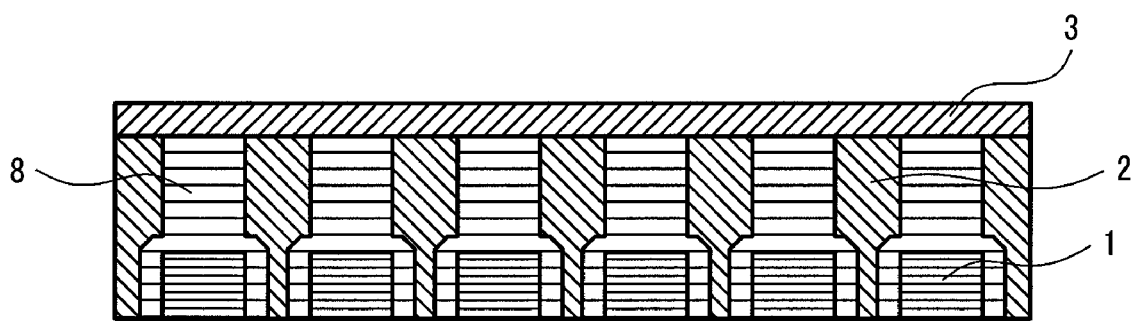
FIG. 15 is a cross sectional view showing a portion in the vicinity of a DRAM memory cell.
Figure 16:
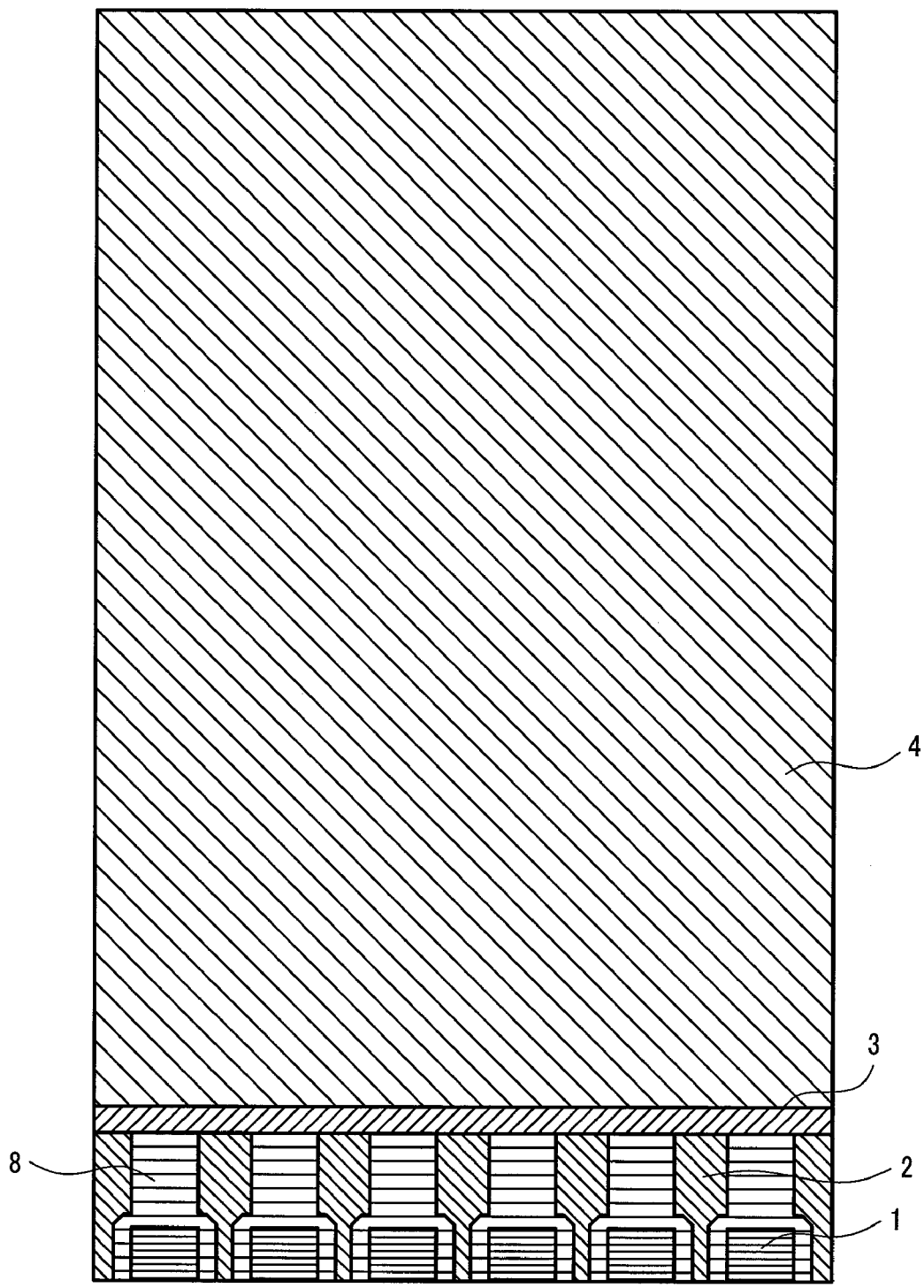
FIG. 16 is a cross sectional view showing a portion in the vicinity of a DRAM memory cell.
Figure 17:
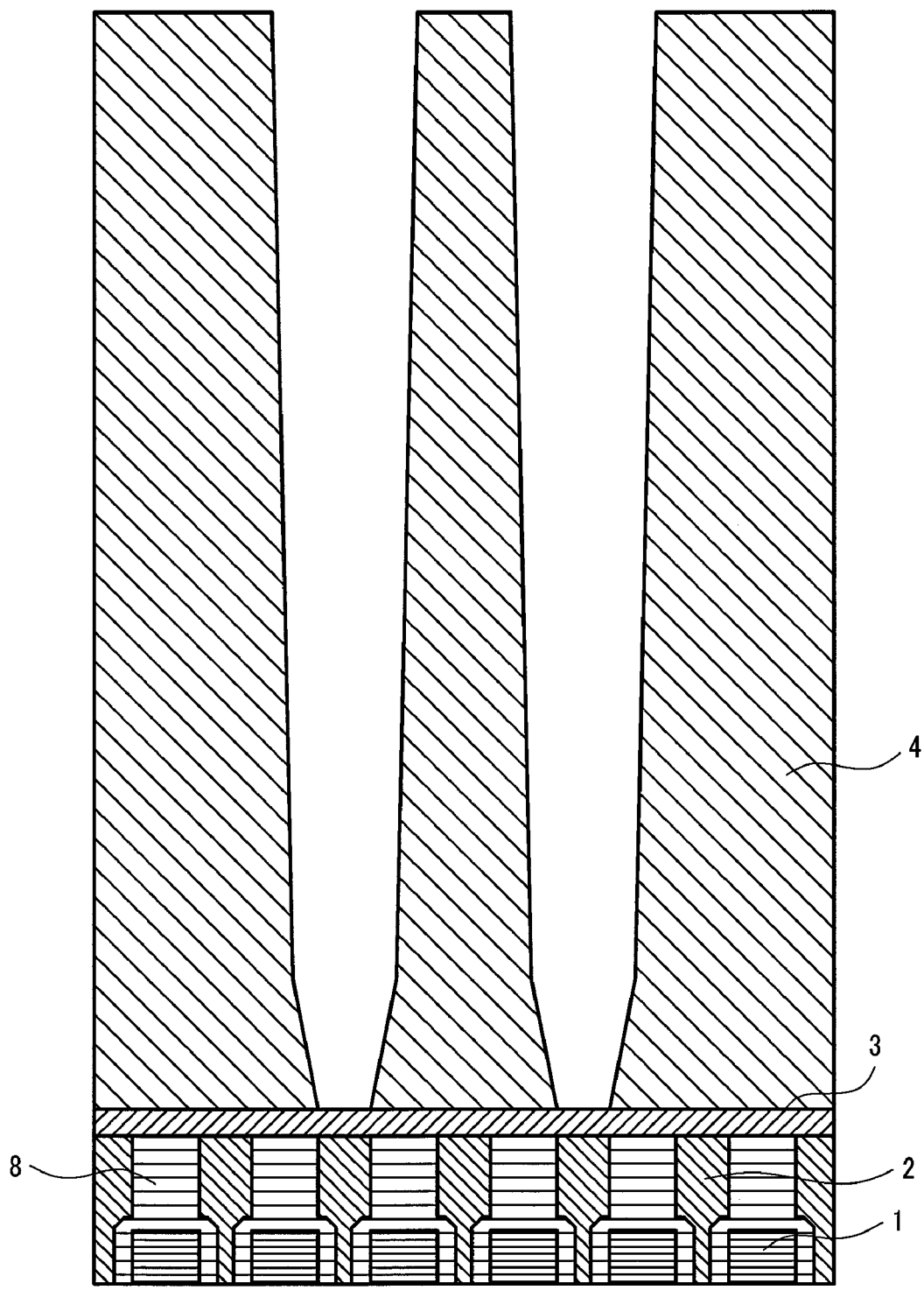
FIG. 17 is a cross sectional view showing a portion in the vicinity of a DRAM memory cell.
Figure 18:
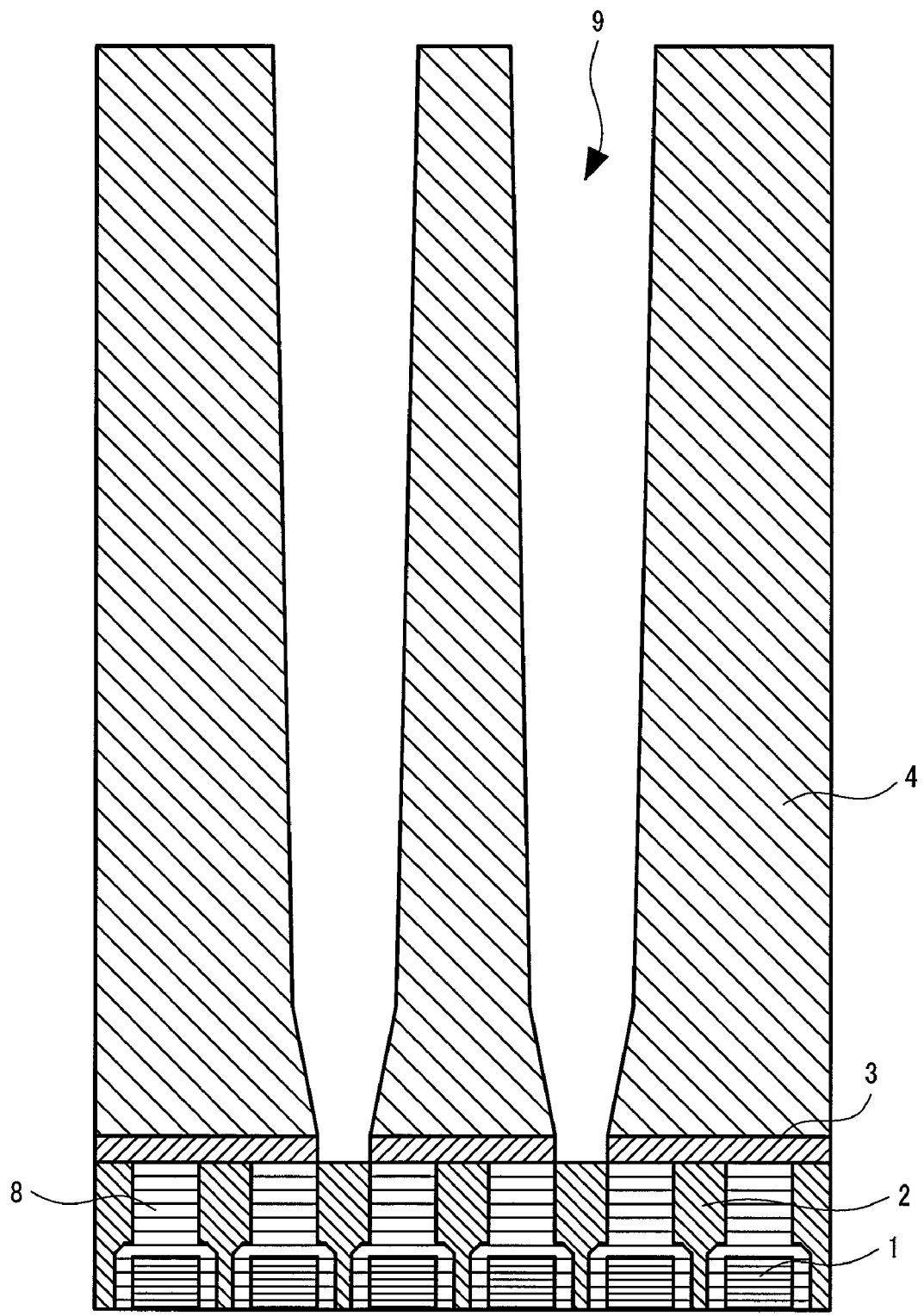
FIG. 18 is a cross sectional view showing a portion in the vicinity of a DRAM memory cell.
Figure 19:
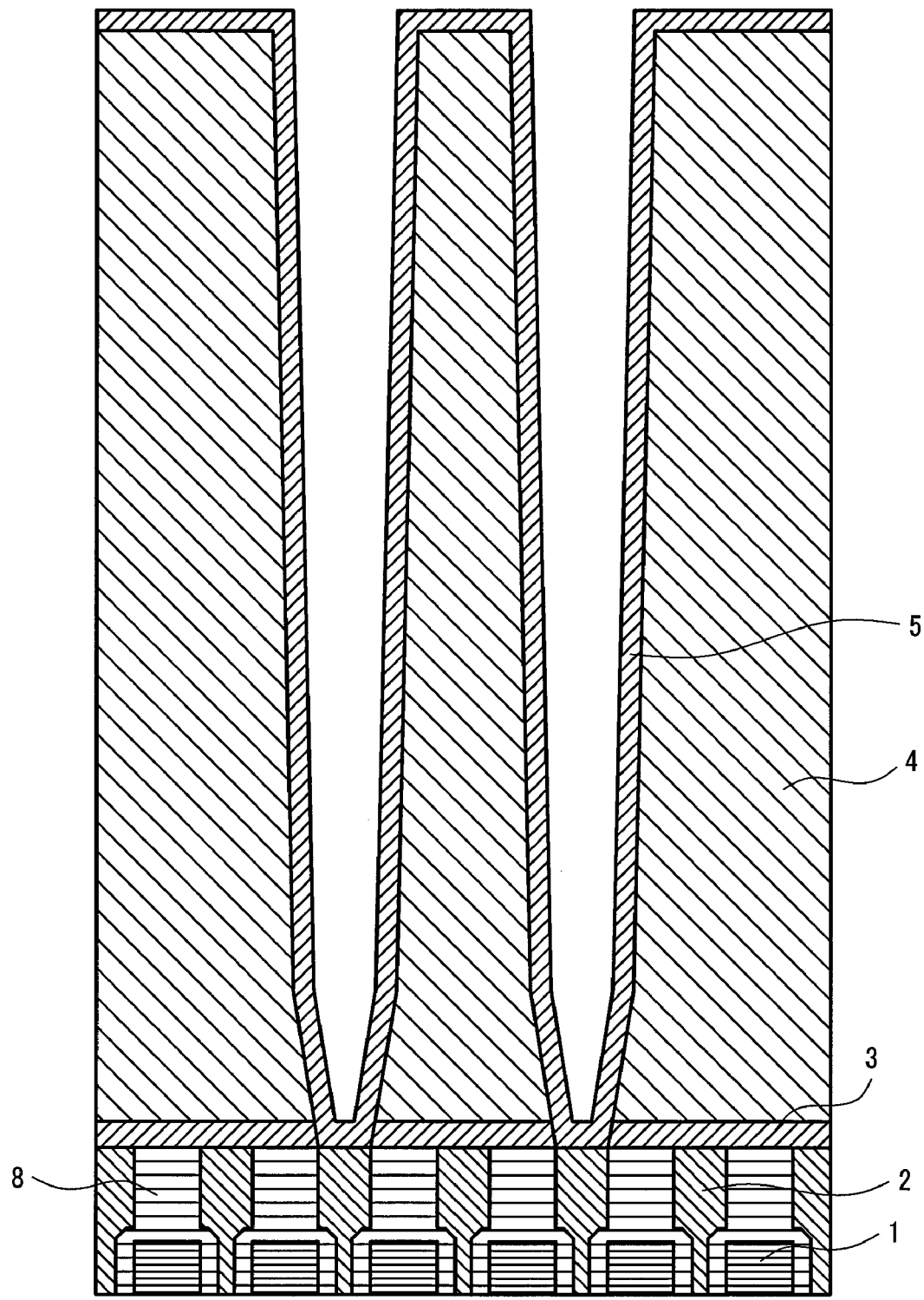
FIG. 19 is a cross sectional view showing a portion in the vicinity of a DRAM memory cell.
Figure 20:
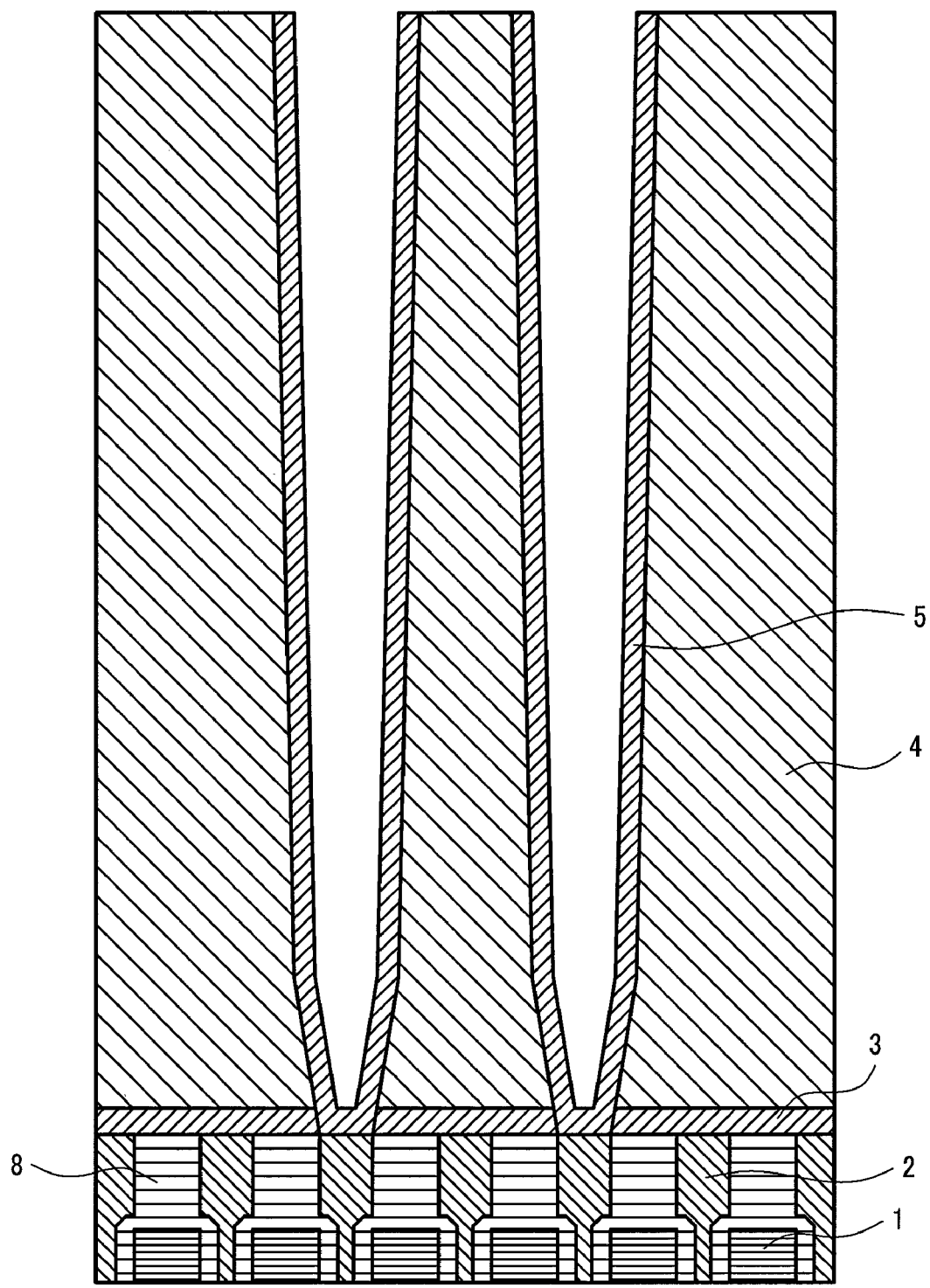
FIG. 20 is a cross sectional view showing a portion in the vicinity of a DRAM memory cell.
Figure 21:
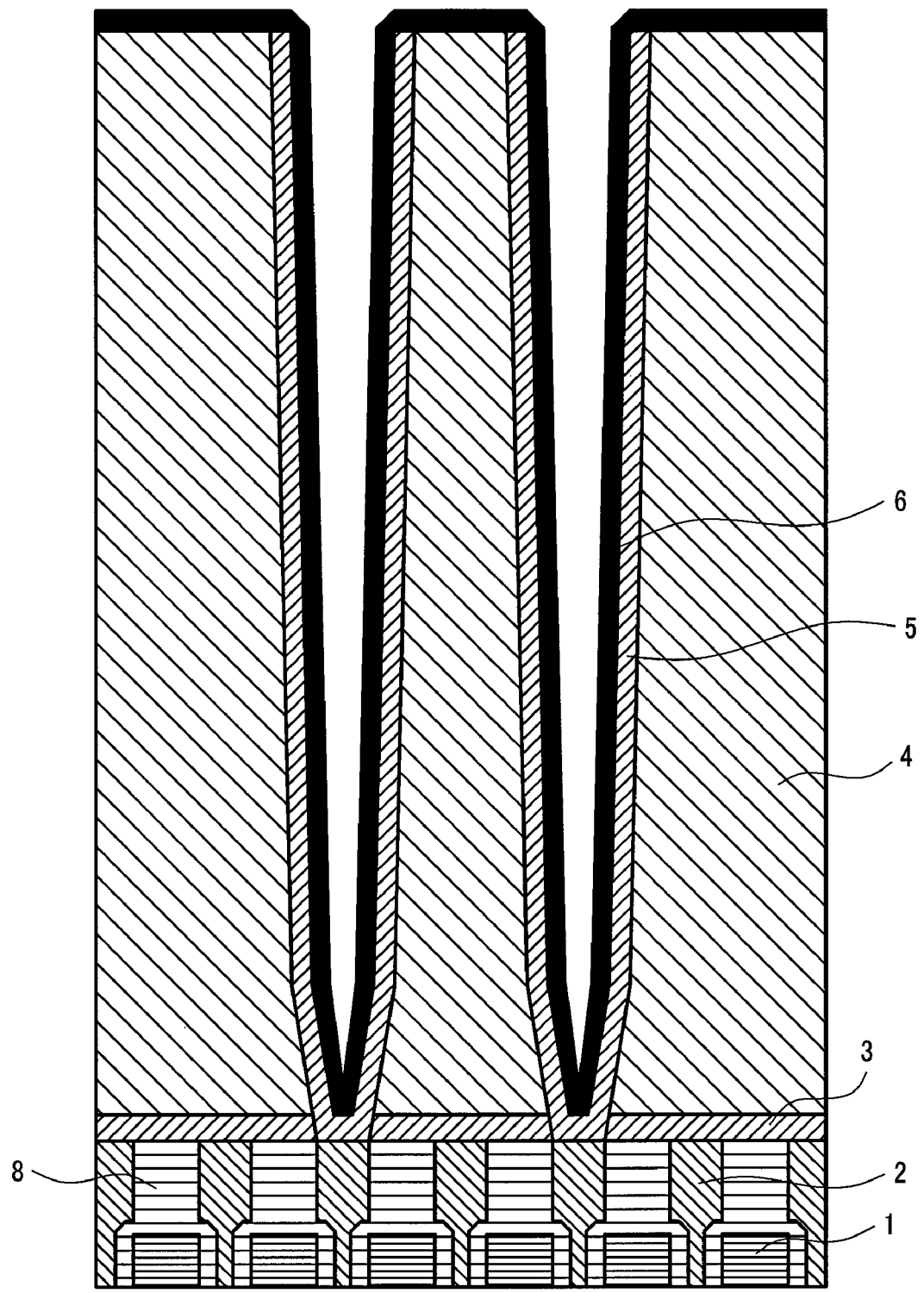
FIG. 21 is a cross sectional view showing a portion in the vicinity of a DRAM memory cell.
Figure 22:
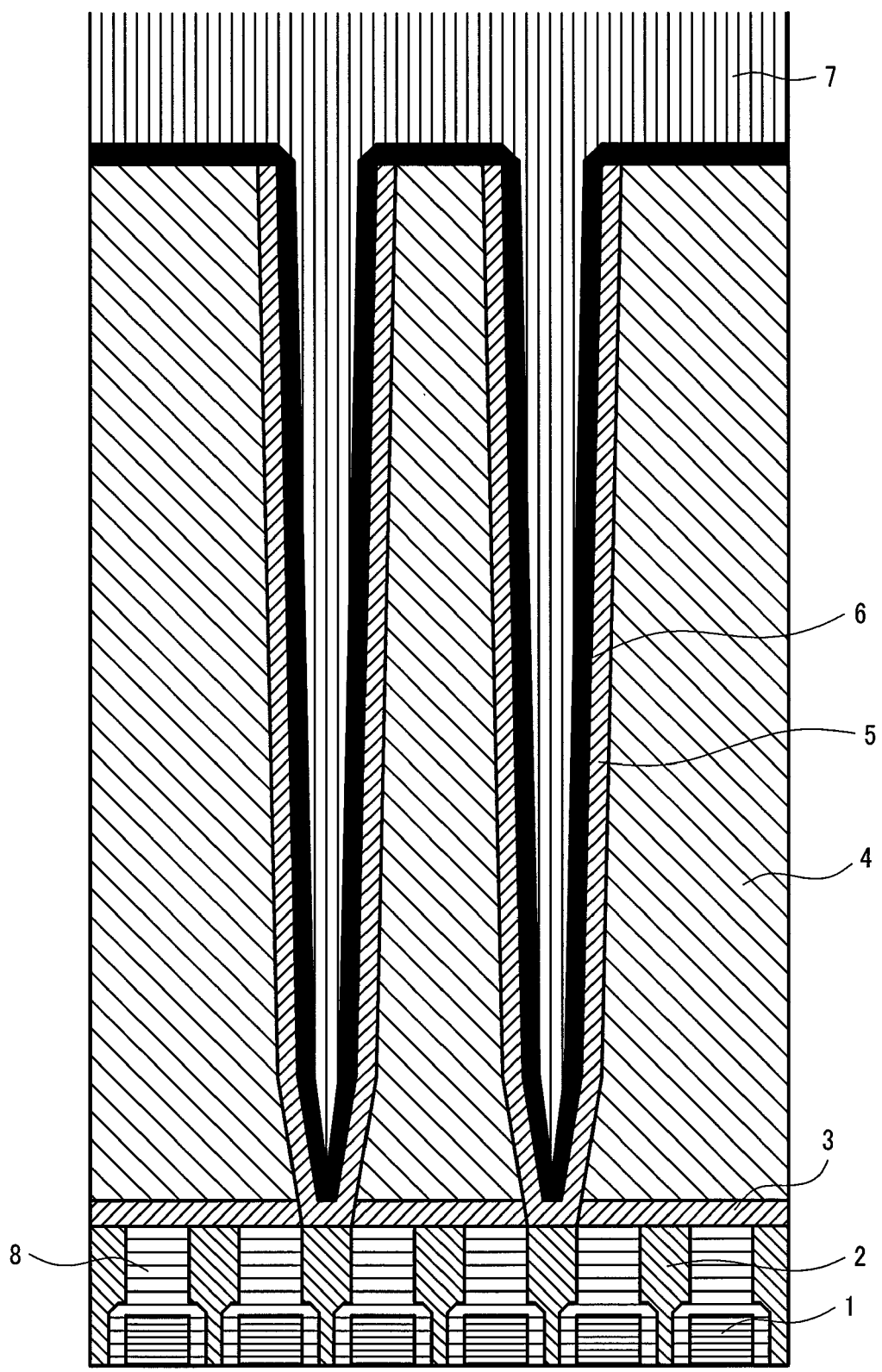
FIG. 22 is a cross sectional view showing a portion in the vicinity of a DRAM memory cell.

A silicon nitride film 3 of about 100 nm thickness was deposited thereover by a chemical vapor deposition (hereinafter referred to as CVD) method as shown in FIG. 15 and used as an etching stopper upon fabrication of the silicon nitride film 3. Then, as shown in FIG. 16, a silicon oxide film 4 using tetraethoxy silane as the precursor is formed above the silicon nitride film 3. The silicon oxide film 4 is fabricated by a dry etching method using, as a mask, a material having a high etching selectivity to the silicon oxide film such as a photoresist film, polysilicon tungsten, or carbon and, further, the silicon nitride film 3 is dry etched continuously to form a trench 9 for a lower electrode above the polysilicon plug 2 as shown in FIG. 18. Further, as shown in FIG. 19, a titanium nitride film 5 is deposited by 35 nm on the lower electrode material. As the lower electrode material, tungsten, phosphorus-doped silicon, ruthenium, gold, silver, titanium, tungsten nitride, platinum or copper is also applicable. Then, the titanium nitride film 5 is separated on every bits by a known etching back technique using a photoresist film as shown in FIG. 20. Titanium oxide is formed to about 2 nm on the surface of titanium nitride upon inter-apparatus transportation. The titanium oxide is removed by wet etching using, for example, hydrofluoric acid. Successively, yttrium-stabilized hafnia corresponding to the insulating film 6 is deposited as shown in FIG. 21 by the atomic layer deposition method shown previously. Then, as shown in FIG. 22, titanium nitride 7 intended for the upper electrode 7 is deposited by a CVD method. For the upper electrode material, phosphorus-doped polysilicon, tungsten, tungsten nitride, ruthenium, gold, silver, titanium, platinum, and copper are also applicable.

Second Embodiment

A second embodiment discloses a deposition method of yttrium-stabilized hafnia by an atomic layer deposition method, and a method of controlling the yttrium addition amount at a high accuracy, not requiring conditioning and control for the time of precursor introduction at such a high accuracy as in the method disclosed in the first embodiment.

Figure 23:
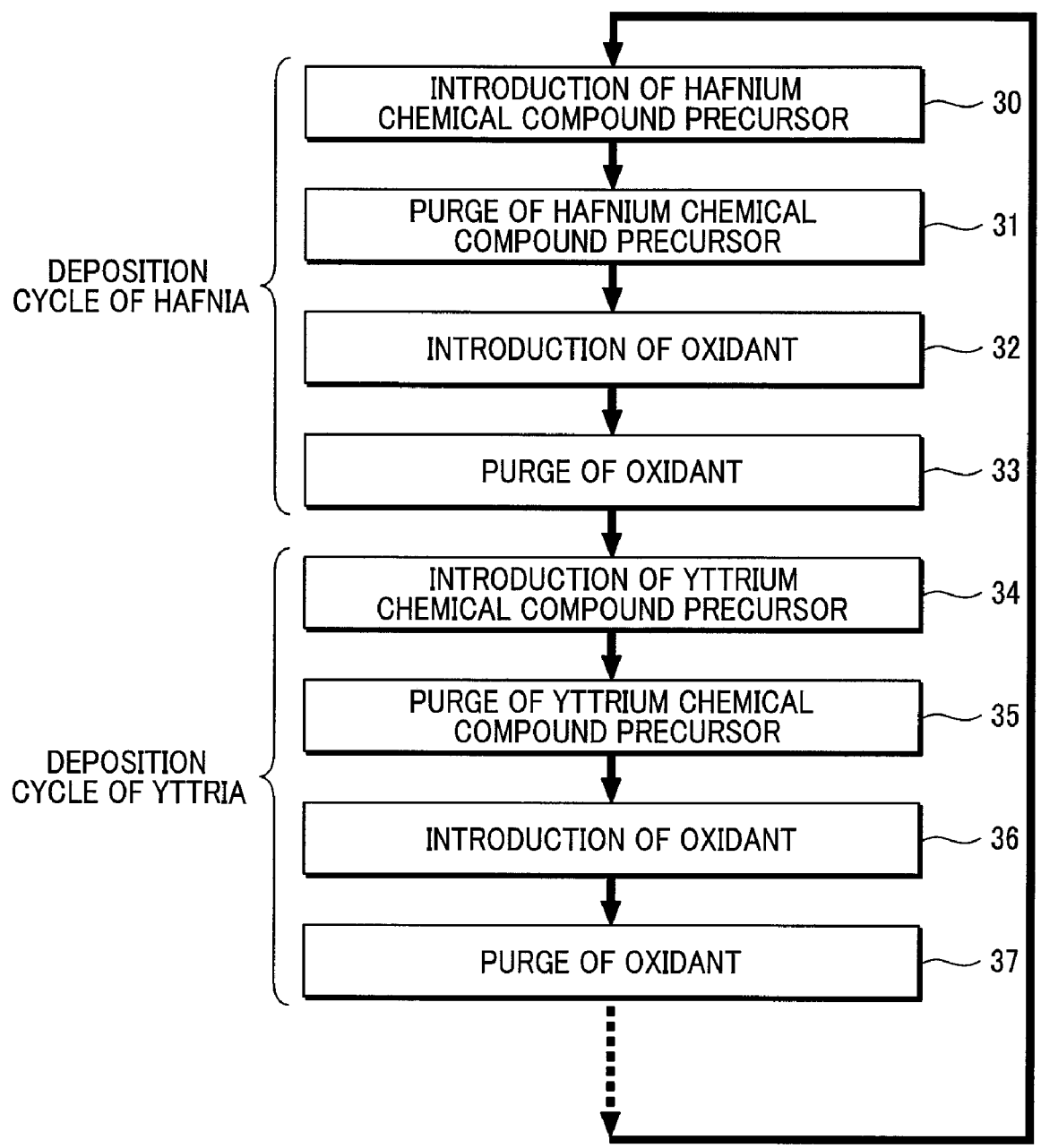
FIG. 23 is a process chart of atomic layer deposition of yttrium-stabilized hafnia.
Figure 24:
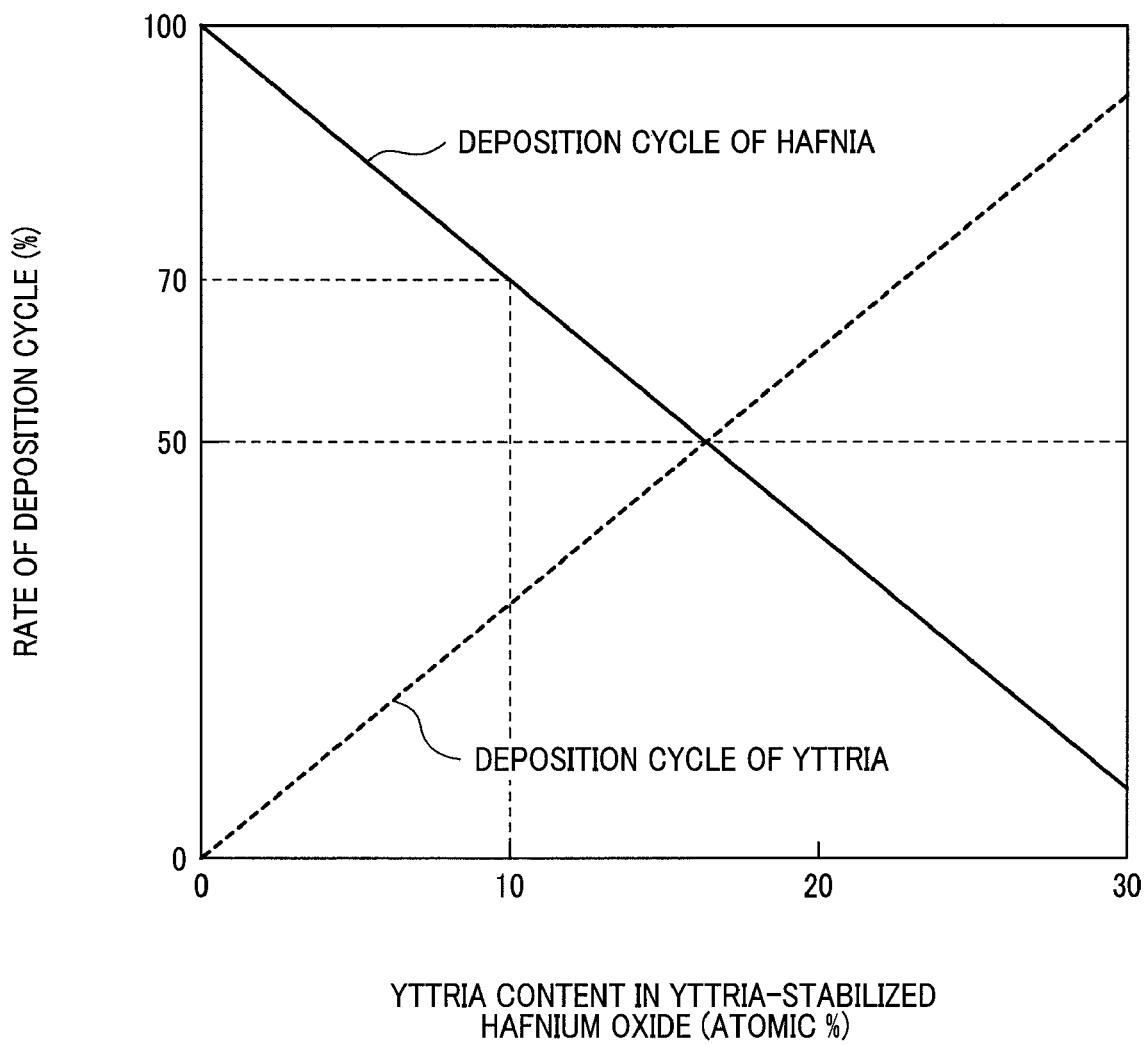
FIG. 24 is a graph showing the ratio of each deposition cycle for obtaining a desired yttrium addition amount.
Figure 25:
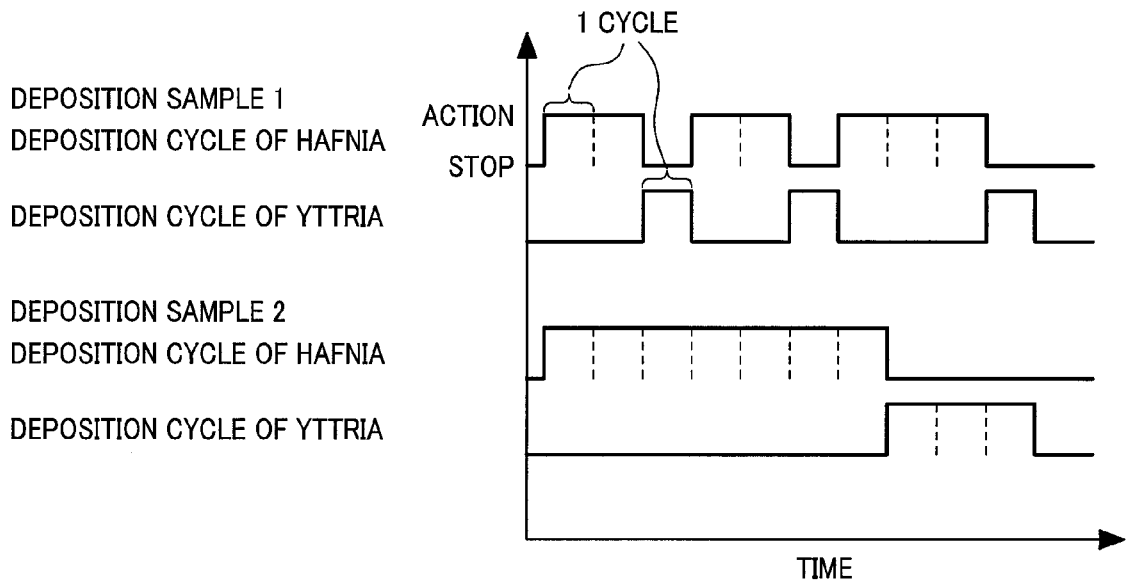
FIG. 25 is a timing chart upon deposition of yttrium-stabilized hafnia.

As shown in FIG. 23, the deposition method is performed by repeating a hafnia deposition cycle including four steps of introduction (30) and purge (31) of a hafnium compound precursor and introduction (32) and purge (33) of an oxidant, and an yttria deposition cycle including four steps of introduction (34) and purge (35) of an yttrium compound precursor and introduction (36) and purge (37) of an oxidant. Each of the steps is performed a predetermined number of cycles such that the addition amount of yttrium reaches a desired value. The ratio of the number of the hafnia deposition cycle to the number of the yttria deposition cycle was calculated considering that yttrium is replaced with hafnium in hafnia since the addition amount of the yttrium is small. FIG. 24 shows the result. The ordinate shows the ratio of the hafnia deposition cycle to the yttria deposition cycle in order to obtain a desired yttrium content (abscissa). As the yttrium content increases, the rate of the hafnia deposition cycle decreases and the rate of the yttria deposition cycle increases. For example, in a case where the yttrium content in the yttrium-stabilized hafnia is intended to be 10%, this can be obtained by defining the hafnia deposition process cycle to 70% and the yttria deposition process cycle to 30%. FIG. 25 shows a timing chart for the hafnia deposition process and the yttria deposition process in this case. For the sake of simplicity, description is to be made of a case where the hafnia deposition process is 7 cycles and the yttrium oxide deposition process is three cycles. In 10 cycles, each process may be conducted a predetermined number, and the sequence for each of the processes is different depending on whether the uniformity of the film composition is considered to be important, or whether it adopts a mixed phase of polycrystals of hafnia and yttrium oxide. In a case where the uniformity of the film composition is considered to be important, the hafnia deposition process and the yttrium oxide deposition process should be conducted alternately as in Deposition Example 1. On the other hand, in a case of intending to obtain a mixed phase of hafnia and yttrium oxide, it is desirable to conduct the hafnia deposition process and the yttrium oxide deposition process continuously as much as possible as in Deposition Example 2.

Figure 26:
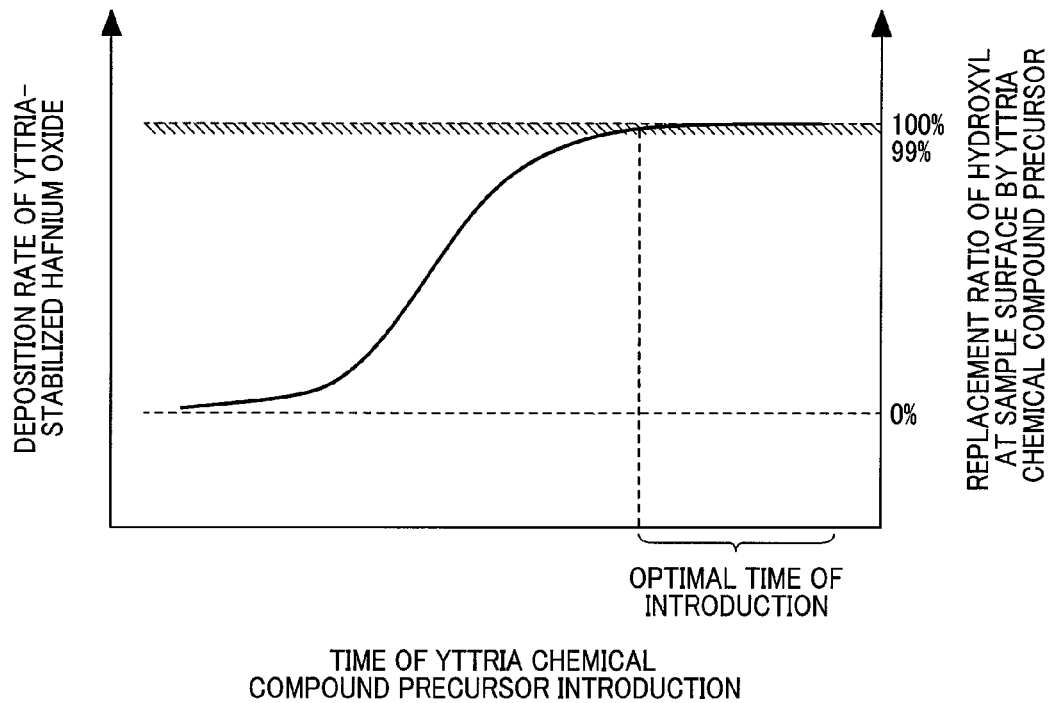
FIG. 26 is a graph showing an optimal time of yttrium compound precursor introduction for controlling the yttrium stabilization amount to 10%.

Then, in the deposition method shown in this example, the time of introduction and purge of each precursor capable of deposition of yttrium-stabilized hafnia with less voids or defects is disclosed. At first, the yttria deposition process is to be disclosed. As has been described previously, the yttria deposition process is divided into four steps of introduction of a yttrium compound precursor, purge of a yttrium compound precursor, introduction of an oxidant and purge of the oxidant. In the introduction of the yttrium compound precursor, OH groups on the sample surface are replaced with the yttrium compound precursor and FIG. 26 shows a relation between the time of yttrium compound precursor introduction and the deposition rate of yttrium-stabilized hafnia in this case. As shown previously, the deposition rate of yttrium-stabilized hafnia can be replaced with the replacement ratio of the OH groups on the sample surface to the yttrium compound precursor. As the time of yttrium compound precursor introduction increases, the replacement ratio of the OH groups on the sample surface to the yttrium compound precursor increases from 0% and then is saturated at 100%. In this case, it is desirable that the replacement ratio of the OH groups on the sample surface to the yttrium compound precursor is 100%. However, since the time of yttrium compound precursor introduction is extremely longer for completely attaining 100% and impurities may possibly be caused due to excess introduction of the yttrium compound precursor, it is targeted to 99% or more. That is, the time of yttrium compound precursor introduction is determined such that the replacement ratio of the OH groups on the sample surface to the yttrium compound precursor is 99% or more. This enables deposition of yttrium-stabilized hafnia with less defects or voids due to not replaced OH groups.

Successively, the yttrium compound precursor is purged. Purging is conducted desirably for a long time enough to decrease the remaining yttrium compound precursor sufficiently. However, since no extremely long time can be applied in order to improve the throughput of deposition, an appropriate time of purge should be applied while taking a countermeasure, for example, suppression of physical adsorption due to increase in the deposition temperature.

Figure 27:
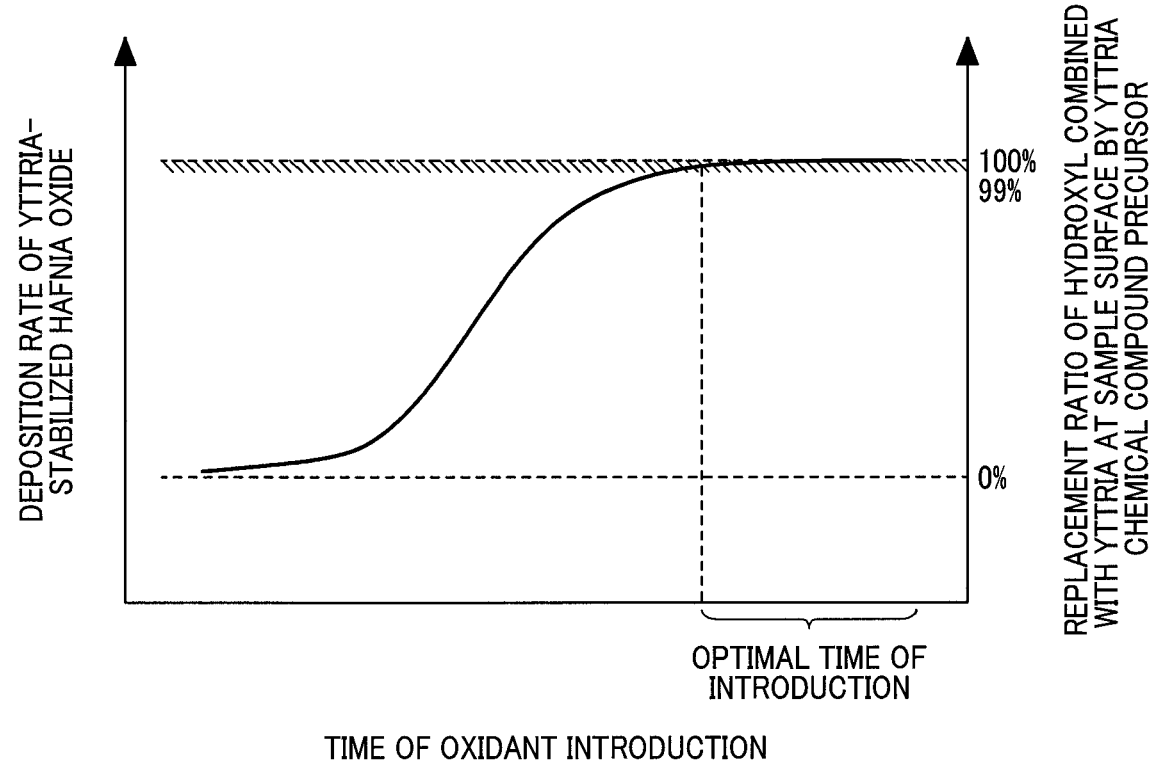
FIG. 27 is a graph showing an optimal time of an oxidant introduction for controlling the yttrium stabilization amount to 10%.

Then, the oxidant is introduced. This is a step of replacing the groups of the yttrium compound precursor bonded with yttrium on the sample surface into OH groups. The time of oxidant introduction and the oxidation ratio of the yttrium compound precursor on the sample surface by the oxidant (replacement ratio by OH group) is qualitatively identical with that of the oxidation step in alumina deposition shown in the first embodiment. FIG. 27 shows the replacement ratio of the groups of the yttria compound bonded with yttria adsorbed on the sample surface in accordance with the time of oxidant introduction. As shown in FIG. 27, the deposition rate of yttrium-stabilized hafnia is determined by a time of oxidant introduction such that the replacement ratio of the yttrium compound precursor on the sample surface by the OH groups is 99% or more. As a result, it is possible to suppress occurrence of impurities due to inactive molecules of the yttrium compound precursor bonded with yttrium, and defects and voids. It is desirable that the time of oxidant purge is sufficiently long enough to decrease the residual oxidant. However, to improve the throughput of the deposition, since extremely long time is not appropriate, an appropriate time of purge should be applied while taking countermeasure such as suppression of physical adsorption due to increase in the deposition temperature.

While details of the deposition cycle of yttrium oxide have been described above, this may be applicable substantially identically also for the deposition cycle of hafnia. The hafnia deposition cycle is divided into four steps of introduction of a hafnium compound precursor, purge of the hafnium compound precursor, introduction of an oxidant, and purge of the oxidant. It is necessary to determine the time of precursor introduction such that the ratio of replacing the hafnium compound precursor or the OH groups on the sample surface to the OH groups or the hafnium compound precursor to 99% or more. Further, also in the purging step for each of the precursors, it is necessary to ensure a sufficiently long purging time such that the residual products and by-products of each precursor are not remained.

By using the deposition cycle of yttrium oxide and the deposition cycle of hafnia described so far the number of times corresponding to the ratio shown in FIG. 24, it is possible to accurately control the yttrium addition amount of yttrium-stabilized hafnia.

This deposition process has a feature in that all the replacement reactions on the sample surface are targeted for 99% or more by the introduction of each precursor. The feature shows an advantage that the margin for the time of precursor introduction can be taken larger compared with the case of intending to a specific replacement ratio which is more than 0% and less than 99% for the replacement ratio of groups exposed to the sample surface by the introduction of the precursor. This is because the time of introduction may be set so that the precursor replacement ratio is 99% or more and 100% or less, providing that the precursor replacement ratio is 99% or more and 100% or less.

However, the film deposited by the deposition method has a drawback that the uniformity of each element is poor compared with that by the method shown in the first embodiment. In the first embodiment, for the replacement of the surface OH groups, since they are replaced by about 70% with the hafnium compound precursor and about 30% of the remaining precursor is replaced with the yttrium compound precursor, hafnium and yttrium are mixed together at the level of the atomic layer. However, in this method, the sample surface is replaced by 99% or more with the hafnium compound precursor and then the OH groups are replaced by 99% or more with the yttrium compound precursor after oxidation. Accordingly, it has a feature of forming a layer containing more hafnium and a layer containing more yttrium. In a case where it is necessary to dissolve such compositional variation formed by the deposition method, there may be countermeasure, for example, of making the composition uniform by applying a heat treatment to the sample thereby diffusing each of the elements after deposition.

In the method described above, the yttrium-stabilized hafnia can be deposited at a good controllability for the yttrium addition amount by the atomic layer deposition method. Further, the atomic layer deposition method for ternary materials described above is applicable also to other materials than yttrium-stabilized hafnia. For example, the other materials are applicable to deposition of a material obtained by adding a material such as hafnium, aluminum, yttrium, zirconium, lanthanum, niobium, tantalum, titanium, scandium, and silicon to a material such as hafnia, alumina, yttria, zirconia, lanthanum trioxide, niobium pentoxide, tantalum pentoxide, titanium dioxide, scandium trioxide, and silicon dioxide.

Typical processes for forming DRAM prepared by using this insulating film are the same as those of the method disclosed in the first embodiment.

Third Embodiment

Figure 28:
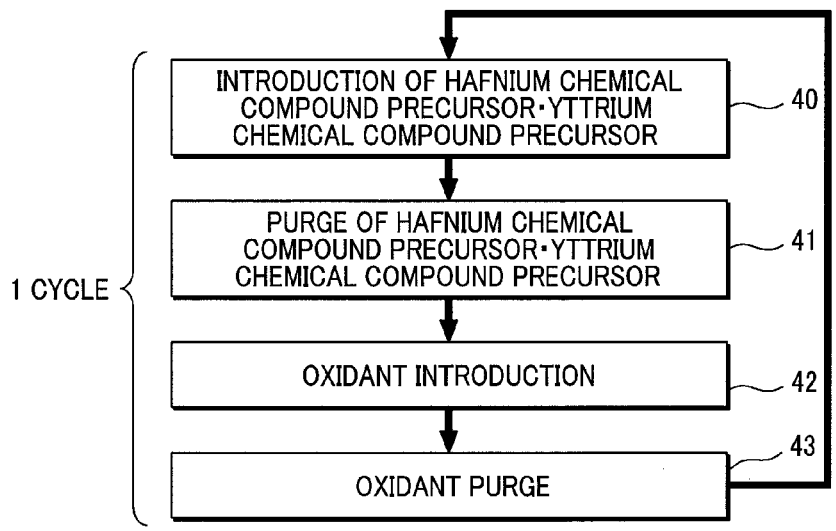
FIG. 28 is a process chart upon atomic layer deposition of yttrium-stabilized hafnia.

In a third embodiment, deposition of yttrium-stabilized hafnia by the atomic layer deposition method is divided into four steps of introduction (40) and purge (41) of a gas mixture of a hafnium compound precursor and an yttrium compound precursor, and introduction (42) and purge (43) of an oxidant as shown in FIG. 28. A value estimated based on the adsorption probability calculated by using a sticking coefficient is used for the partial pressure of each precursor gas so as to obtain a desired yttrium addition amount in the introduction step of the gas mixture of the hafnium compound precursor and the yttrium compound precursor.

Figure 29:
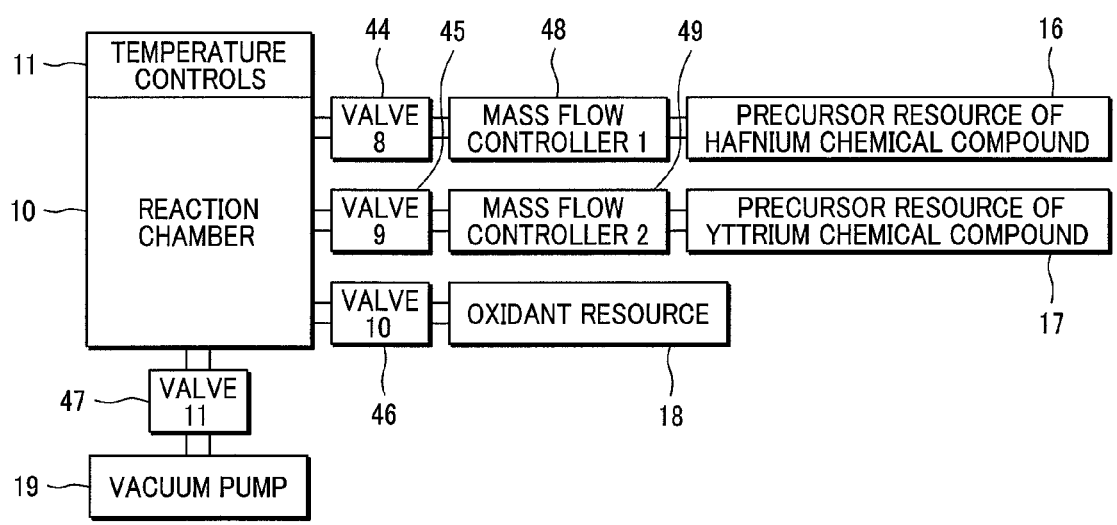
FIG. 29 is a constitutional view of an apparatus for atomic layer deposition of yttrium-stabilized hafnia.

FIG. 29 shows an example of a constitution of the deposition apparatus. A hafnium compound precursor resource 16 and an yttrium compound precursor resource 17 are connected, for example, by way of mass flow controllers 48, 49 capable of controlling flow rates and valves 44, 45, respectively to a reaction chamber 10. The portion may be constituted such that the partial pressure of each precursor introduced to the reaction chamber 10 can be controlled. Further, the oxidant 18 is connected only by way of a valve 46 to the reaction chamber. Further, a pump 19 is also connected by way of a valve 47 to the reaction chamber 10. A temperature control device 11 capable of controlling the reaction chamber temperature between 200° C. and 500° C. is provided to the reaction chamber. Reference numeral 19 denotes a vacuum pump; and 47, a valve therefor.

In the present embodiment, in order to control the yttrium addition amount in yttrium-stabilized hafnia to 10%, the following method is used: a method of adsorbing the hafnium compound precursor to 70% of the OH groups and adsorbing the yttrium compound precursor to the remaining 30% of the OH groups on the sample surface. The percentage used herein is based on the same concept as that of the replacement ratio of the OH groups at the sample surface as described with reference to FIG. 10 in the first embodiment. In the first embodiment, replacement of the OH groups on the sample surface includes four steps of introduction and purge of the hafnium compound precursor and introduction and purge of the yttrium compound precursor. The replacement of the OH groups with the hafnium compound precursor and the replacement of the OH groups with the yttrium compound precursor are conducted in separate steps. On the other hand, in the present embodiment, since the replacement of the OH groups is conducted by two steps of introduction and purge of the hafnium compound precursor and the yttrium compound precursor, the replacement of the OH groups with the hafnium compound precursor and the replacement of the OH groups with the yttrium compound precursor are conducted simultaneously in the same step.

For the method of replacing 70% of the OH groups with the hafnium compound precursor and the 30% of the OH groups with the yttrium compound precursor by exposing a gas mixture of the hafnium compound precursor and the yttrium compound precursor to the sample in which the OH groups are exposed to the sample surface, a method of controlling the pressure for each precursor and aligning the ratio of the adsorption probability for each of the precursors calculated by using a sticking constant is used. Assuming the replacement probability of the OH groups on the sample surface, partial pressure, and the sticking coefficient of the hafnium compound precursor are defined as $r_{Hf}$, $p_{Hf}$, and $s_{Hf}$, respectively, and the replacement possibility of the OH groups on the sample surface, partial pressure-sticking coefficient of the yttrium compound precursor are defined as $r_Y$, $p_Y$, and $s_Y$, respectively, the following relationship is established:

$$r_{Hf} \propto p_{Hf} \times s_{Hf} \quad r_Y \propto p_Y \times s_Y.$$

Then, the ratio of the replacement ratio ($r_Y$) of the OH groups on the sample surface with the yttrium compound precursor and the replacement ratio ($r_{Hf}$) of the OH groups on the sample surface with the hafnium compound precursor can be represented as below.

$$r_Y/r_{Hf} = (p_Y \cdot s_Y)/(p_{Hf} \cdot s_{Hf})$$

By using the formula, the partial pressure ratio ($p_Y/p_{Hf}$) between the partial pressure of the yttrium compound precursor and that of the hafnium compound precursor as a parameter to be applied upon actual deposition can be expressed as below:

$$p_Y/p_{Hf} = (r_Y/r_{Hf}) \times (s_{Hf}/s_Y)$$

Figure 30:
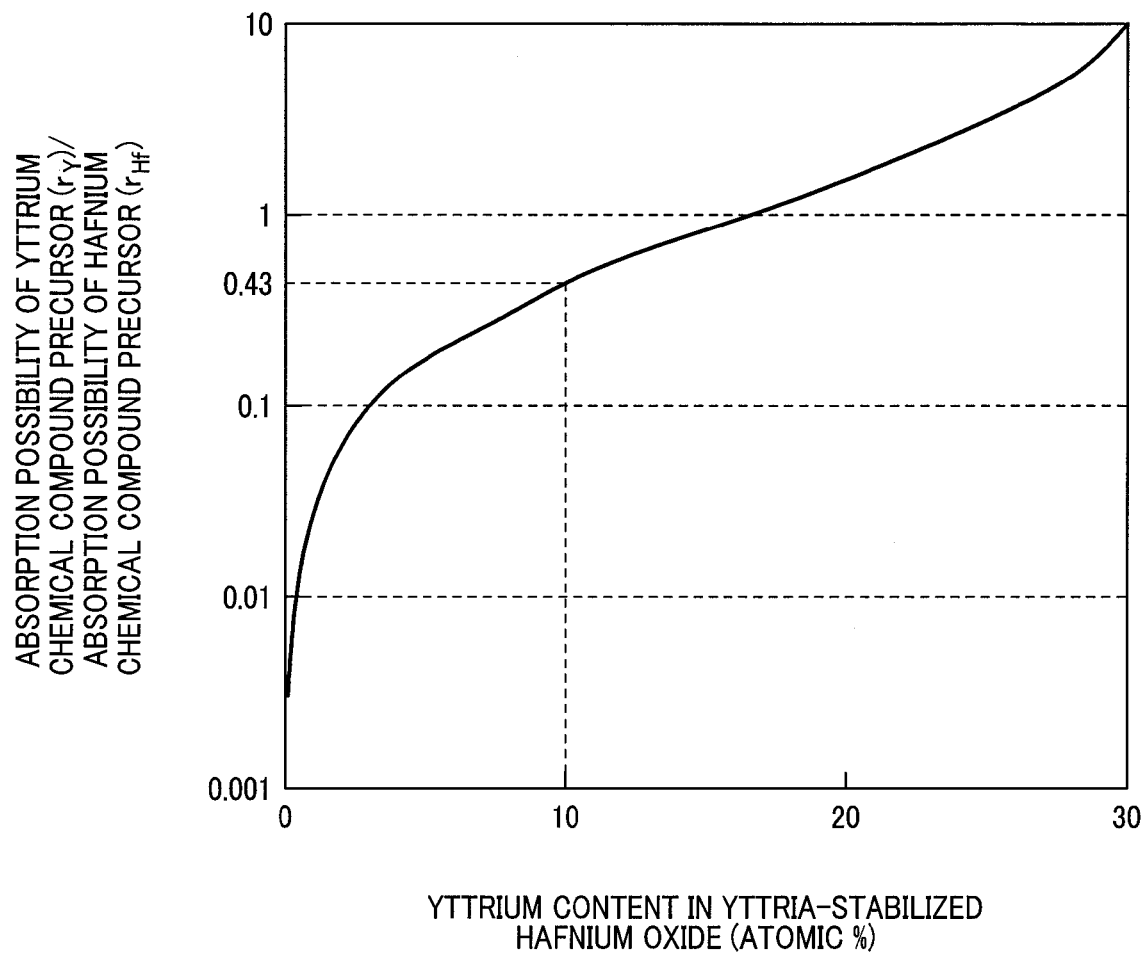
FIG. 30 is a graph showing an adsorption possibility ratio of an yttrium compound precursor and a hafnium compound precursor to adsorption sites on a sample surface for obtaining a desired yttrium stabilization amount.

For the value of ($r_Y/r_{Hf}$), a value in accordance with a desired yttrium addition amount in yttrium-stabilized hafnia is substituted with reference to FIG. 30. Particularly, at the yttrium addition amount of 10%, it is 0.43. Further, the adsorption coefficient for each precursor can be calculated, for example, by ab initio calculation method as described, for example, in reference data 1. Further, it can also be measured actually by photospectrometry. The ordinate in FIG. 30 is calculated by using the value in FIG. 10. The obtained value: $p_Y/p_{Hf}$ is a partial pressure ratio of the yttrium compound precursor to the hafnium compound precursor for obtaining a desired yttrium addition amount, and a mass flow controller 1 and a mass flow controller 2 are controlled such that the partial pressure ratio in the reaction chamber is an intended value. By using this method, OH groups on the sample surface are replaced by 70% with the hafnium compound precursor and by 30% with the yttrium compound precursor by the introduction step for the hafnium compound precursor and the yttrium compound precursor, and yttrium-stabilized hafnia with yttrium addition amount of 10% can be deposited by conducting deposition in this cycle.

In the method described above, the yttrium-stabilized hafnia can be deposited at a good controllability for the yttrium addition amount by the atomic layer deposition method. Further, the atomic layer deposition method for ternary materials described above is applicable also to other materials than yttrium-stabilized hafnia. The other materials are applicable to the deposition of a material obtained by adding a material such as hafnium, aluminum, yttrium, zirconium, lanthanum, niobium, tantalum, titanium, scandium, and silicon to a material such as hafnia, alumina, yttrium oxide, zirconia, lanthanum trioxide, niobium pentoxide, tantalum pentoxide, titanium dioxide, scandium trioxide, and silicon dioxide.

Further, a typical process for forming DRAM prepared by using the insulating film is the same as the method as disclosed in the first embodiment.

A relation of an oxygen pressure to the deposition of elements has been studied. This is disclosed, for example, in International Electron Device Meeting (IEDM) 2003, proceeding, "A Model for $Al_2O_3$ ALD conformity and deposition rate from oxygen precursor reactivity".

Fourth Embodiment

A fourth embodiment discloses a method of forming yttrium-stabilized hafnium oxide by alternately conducting hafnium deposition by the atomic layer deposition method and deposition of yttrium by CVD or other methods capable of conformal deposition also for a shape with a high aspect ratio.

Figure 31:
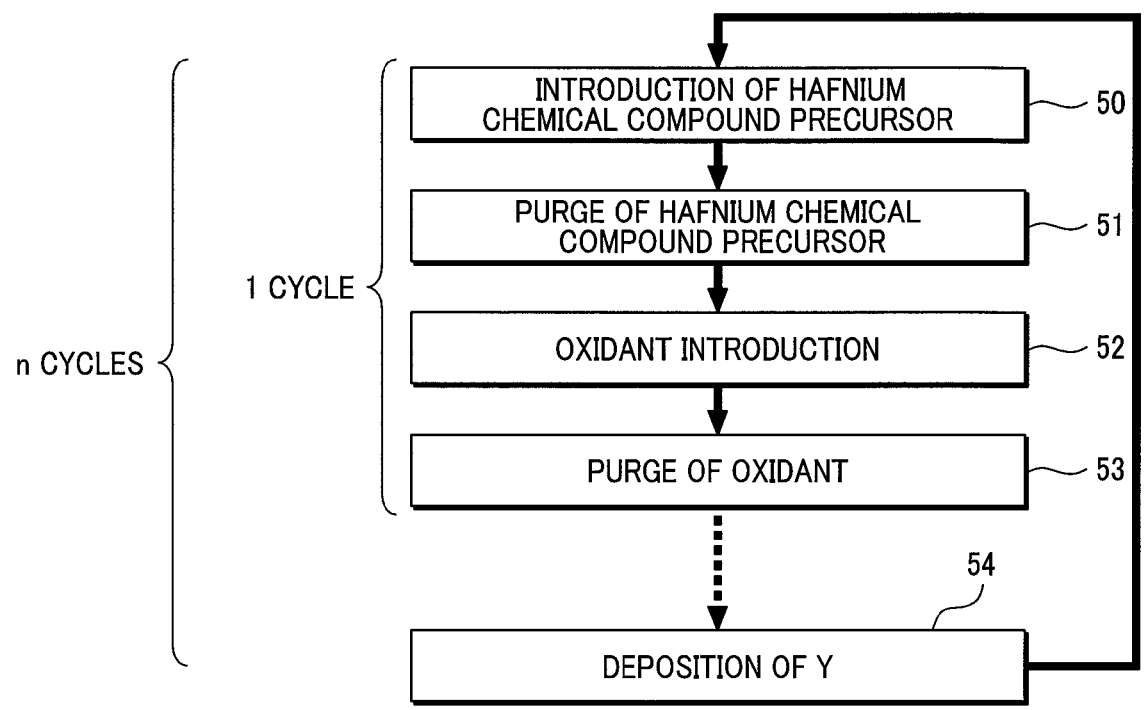
FIG. 31 is a process chart upon atomic layer deposition of yttrium-stabilized hafnia.

FIG. 31 shows the step as described above. Hafnium oxide is deposited using four cycles of introduction (50) and purge (51) of the hafnium compound precursor and introduction (52) and purge (53) of the oxidant as one cycle and repeating the step by one cycle or more. Then, yttrium is deposited by a method such as CVD capable of conformal deposition (54) also for a three-dimensional structure.

To improve the uniformity of elements in the film just after deposition, it is desired to use a method of decreasing the number of cycles of hafnium oxide, reducing the thickness of yttrium and repeating a number of cycles thereby depositing the film with a predetermined thickness. The deposited film has a structure in which yttrium and hafnium oxide are present in a direction of the depth for a short period, and the uniformity of the composition within the film is high.

On the other hand, in the deposition by the atomic layer deposition method or the CVD method, since a time in which deposition is not conducted (incubation) is present just after starting deposition, and the gas phase reaction is not stable, the thickness controllability is poor. As a result, it involves a drawback that the composition of the deposited film is not stabilized. For example, it is difficult to control the content of yttrium in yttrium-stabilized hafnium oxide to 10% with high stability.

Then, to improve the controllability for the composition of the deposited film, the film of hafnium oxide and the film of yttrium deposited alternately are controlled to obtain thicknesses of 2 nm or more for high controllability. As a result, deposition at an accurate composition ratio is possible by conducting the deposition as per the film thickness ratio for each of the materials necessary for obtaining a predetermined composition ratio using the density of hafnium oxide and the density of yttrium. However, this method involves a drawback that the composition of the film just after deposition is not uniform since each of the materials is deposited by 2 nm or more alternately. To make the composition uniform, it is necessary to apply a heat treatment for promoting the deposition of yttrium thereby making the composition uniform after conducting deposition by this method.

Figure 32:
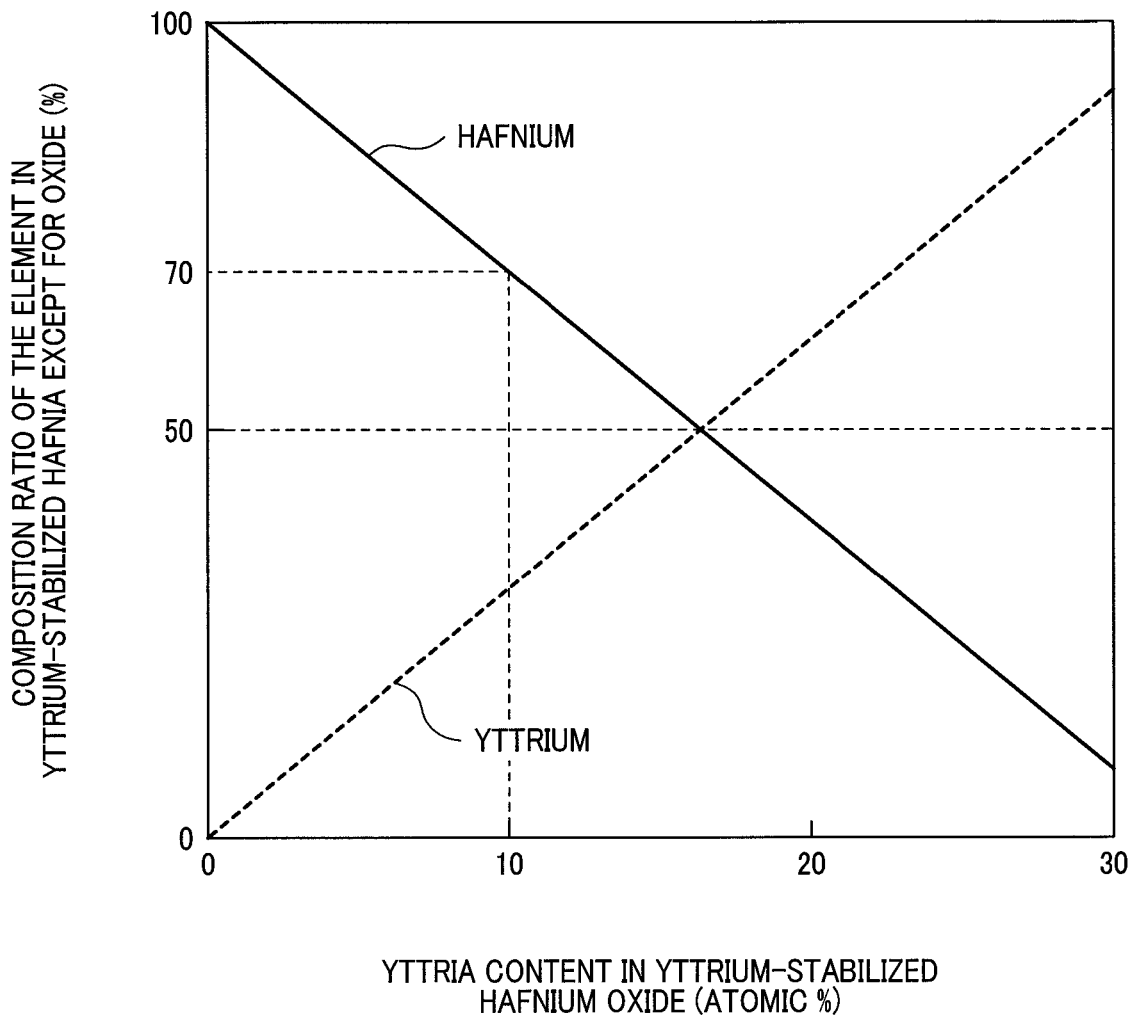
FIG. 32 is a graph showing a composition ratio of elements in yttrium-stabilized hafnia except for oxygen for obtaining a desired yttrium stabilization amount.
Figure 33:
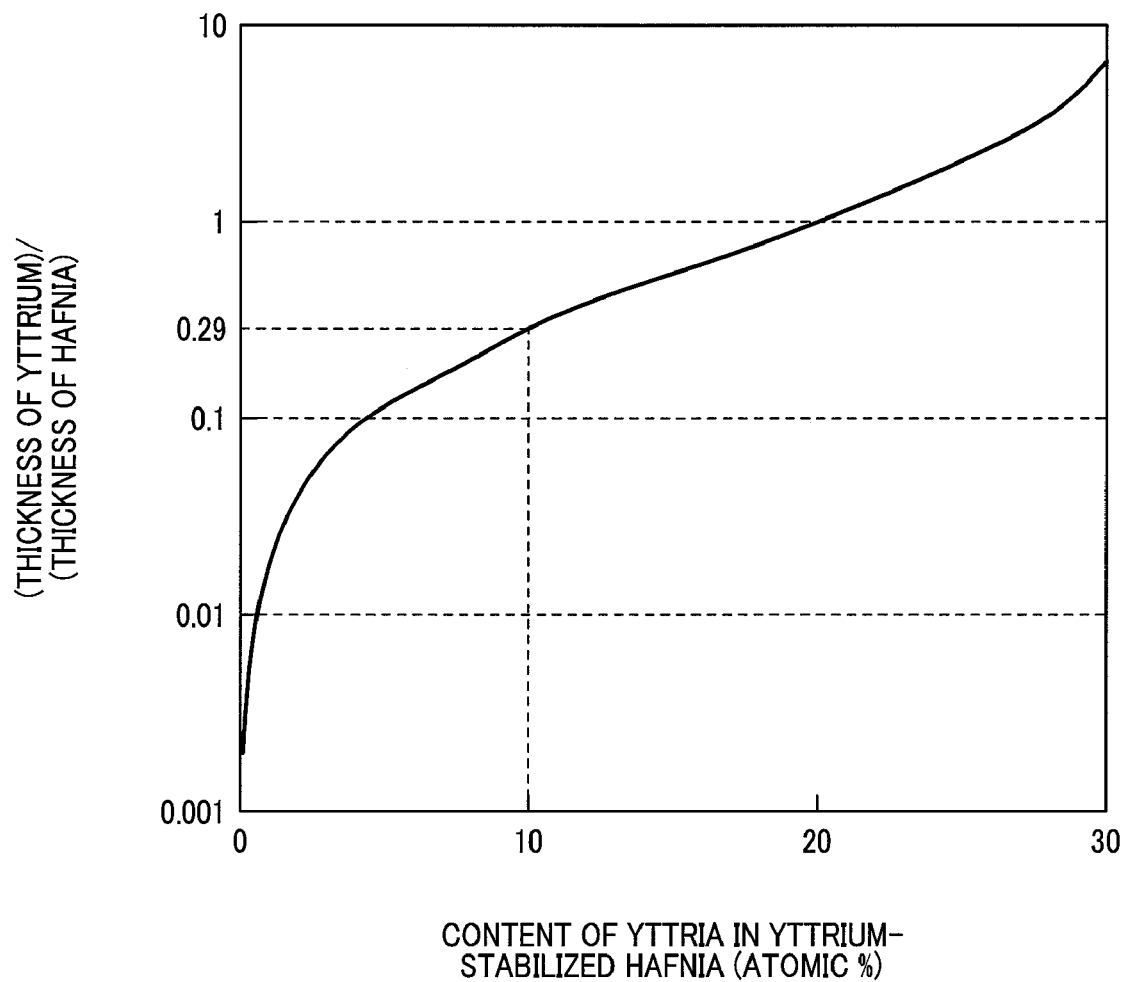
FIG. 33 is a view showing a ratio of yttrium film thickness to a hafnia film thickness for obtaining a desired yttrium stabilization amount.

Then, a description will be made of a method of calculating the thickness ratio between yttrium and hafnium oxide for controlling the yttrium addition amount to 10% in yttrium-stabilized hafnium oxide. Assuming that a hafnium oxide film with addition of yttrium at a certain ratio is present in a predetermined volume and the composition is uniform, the ratio of the number of yttrium atoms to the number of hafnium atoms, which depends on the yttrium addition amount, takes a value as shown in FIG. 32. Particularly, at an yttrium addition amount of 10%, the ratio of the number of hafnium atoms to the number of yttrium atoms is 7:3. Yttrium has a density of 4.48 g/cm$^3$ and a mass number of 39, while hafnia has a density of 6.82 g/cm$^3$ and a mass number of 88. By using the abovementioned values and expressing the thickness of hafnia as x cm and the thickness of yttrium as y cm, the ratio of the number of yttrium to the number of hafnium atoms is represented as x×4.48/39:y×6.82/88. Then, when the ratio y/x is determined such that the ratio determined for the number of atoms is 7:3, the dependence of y/x on the yttrium addition amount shows a relation shown in FIG. 33. Accordingly, to control the addition amount of yttrium, particularly, to 10%, the value of y/x may be 0.29.

In the method described above, the yttrium-stabilized hafnia can be deposited at a good controllability for the yttrium addition amount by the atomic layer deposition method. Further, the atomic layer deposition method for ternary materials described above is applicable also to other materials than yttrium-stabilized hafnia. For example, the other materials are applicable to the deposition of a material obtained by adding a material such as a material such as hafnium, aluminum, yttrium, zirconium, lanthanum, niobium, tantalum, titanium, scandium, or silicon to a material such as hafnia, alumina, yttria, zirconia, lanthanum trioxide, niobium pentoxide, tantalum pentoxide, titanium dioxide, scandium trioxide, or silicon dioxide. Further, deposition of yttrium described in the present embodiment may also be conducted as a deposition of oxide like yttrium oxide. The thickness ratio for each of the materials in this case may be calculated by the same method as described above using the density and the mass number for each of the materials.

Typical processes for forming the DRAM prepared by using this insulating film are the same as those of the method disclosed in the first embodiment.

The present invention has been described specifically above and main aspects of the invention are organized and described below.

(1) A method of manufacturing a semiconductor integrated circuit device having, formed above a semiconductor substrate, a plurality of word lines, a plurality of bit lines, a memory selecting transistors each disposed on a predetermined intersection between the plurality of word lines and the plurality of bit lines, and a memory cell constituted with an information storing capacitors connected electrically in series with the selecting transistors and formed above the semiconductor substrate, in which the information storing capacitor comprises a lower electrode, an upper electrode, and an insulating film put between them, the insulating film comprises a first element, a second element, and oxygen, the insulating film is deposited by a method of exposing a first precursor as a compound containing the first element and a second precursor as a compound containing the second element, and an oxidant containing oxygen alternately to a deposition surface, the adsorption ratio of the first precursor to adsorption sites on a sample surface is 100% or less and the second precursor is adsorbed to the remaining adsorption sites.

(2) A method of manufacturing a semiconductor integrated circuit according to (1) wherein the first element is one of yttrium, hafnium, aluminum, zirconium, lanthanum, niobium, tantalum, titanium, scandium, and silicon. For the first element, while two or more of them in the group described above may also be used, it is practical to use one of them.

(3) A method of manufacturing a semiconductor integrated circuit according to (1) wherein the second element is one of yttrium, hafnium, aluminum, zirconium, lanthanum, niobium, tantalum, titanium, scandium, and silicon. For the second element, while two or more of them in the group described above may also be used, it is practical to use one of them.

(4) A method of manufacturing a semiconductor integrated circuit device according to (1) described above wherein the oxidant is water, ozone, or hydrogen peroxide.

(5) A method of manufacturing a semiconductor integrated circuit device according to (1) described above wherein the content of the first element and the content of the second element in the deposited film are controlled by a replacement ratio on the adsorption sites of the sample surface by the first precursor and the second precursor.

(6) A method of manufacturing a semiconductor integrated circuit device according to (1) described above wherein the first precursor is an yttrium compound and the second element is a hafnium compound.

(7) A method of manufacturing a semiconductor integrated circuit device according to (6) described above, wherein in the step of exposing the hafnium compound to the sample surface, the adsorption ratio of the hafnium compound to adsorption sites on the sample surface is defined as a value between about 65% and 75%, and the yttrium compound is adsorbed to the about 25% to 35% of remaining adsorption sites.

(8) A method of manufacturing a semiconductor integrated circuit device according to (7) described above, wherein the addition amount in yttrium in yttrium-stabilized hafnia is about 10% atomic weight ratio.

(9) A method of manufacturing a semiconductor integrated circuit device having, formed above a semiconductor substrate, a plurality of word lines, a plurality of bit lines, a memory selecting transistors each disposed on a predetermined intersection between the plurality of word lines and the plurality of bit lines, and a memory cell constituted with an information storing capacitors connected electrically in series with the selecting transistors and formed above the semiconductor substrate, in which the information storing capacitor comprises a lower electrode, an upper electrode, and an insulating film put between them, the insulating film comprises a third element, fourth element and oxygen, the insulating film is deposited by combining a first cycle of exposing a third precursor as a compound containing the third element to a deposition surface, and then exposing an oxidant containing oxygen to a deposition surface and a second cycle of exposing a fourth precursor as a compound containing the fourth element to the deposition surface and then exposing the oxidant containing oxygen to the deposition surface, substantially all adsorption sites on the deposition surface are replaced with the third precursor by exposing the third precursor to the deposition surface, and substantially all adsorption sites on the deposition surface are replaced with the fourth precursor by exposing the fourth precursor on the deposition surface.

(10) A method of manufacturing a semiconductor integrated circuit according to (9) described above, wherein the third element is one of yttrium, hafnium, aluminum, zirconium, lanthanum, niobium, tantalum, titanium, scandium, and silicon. For the third element, while two or more of them in the group described above may also be used, it is practical to use one of them.

(11) A method of manufacturing a semiconductor integrated circuit according to (9) described above, wherein the fourth element is one of yttrium, hafnium, aluminum, zirconium, lanthanum, niobium, tantalum, titanium, scandium, and silicon. For the fourth element, while two or more of them in the group described above may also be used, it is practical to use one of them.

(12) A method of manufacturing a semiconductor integrated circuit device according to (9) described above wherein the oxidant is water, ozone, or hydrogen peroxide.

(13) A method of manufacturing a semiconductor integrated circuit device according to (9) described above wherein the content of the third element and the content of the fourth element in the deposited film are controlled by the ratio for the number of cycles of in the first cycle and the number of cycles in the second cycle.

(14) A method of manufacturing a semiconductor integrated circuit device according to (13) described above wherein the third precursor is an yttrium compound and the fourth element is a hafnium compound.

(15) A method of manufacturing a semiconductor integrated circuit device according to (14) described above wherein the ratio of the number of cycles in the first cycle and the number of cycles in the second cycle is about 3:7.

(16) A method of manufacturing a semiconductor integrated circuit device according (15) described above wherein the addition amount of yttrium in yttrium-stabilized hafnia is about 10% with respect to the atomic weight ratio.

(17) A method of manufacturing a semiconductor integrated circuit device having, formed above a semiconductor substrate, plurality of word lines, a plurality of bit lines, a memory selecting transistors each disposed on a predetermined intersection between the plurality of word lines and the plurality of bit lines, and a memory cell constituted with an information storing capacitors connected electrically in series with the selecting transistors and formed above the semiconductor substrate, in which the information storing capacitor comprises a lower electrode, an upper electrode, and an insulating film put between them, the insulating film comprises a fifth element, a sixth element, and oxygen, the insulating film is deposited by repeating a third cycle of exposing a fifth precursor as a compound containing the fifth element and a sixth precursor as a compound containing the sixth element simultaneously to a deposition surface and then exposing the oxidant containing oxygen to the deposition surface, 100% or less of adsorption sites on the deposition surface are replaced with the fifth precursor and the remaining absorption sites are replaced with the sixth precursor by exposing the fifth precursor and the sixth precursor to the deposition surface.

(18) A method of manufacturing a semiconductor integrated circuit according to (17) described above, wherein the fifth element is one of yttrium, hafnium, aluminum, zirconium, lanthanum, niobium, tantalum, titanium, scandium, and silicon. For the fifth element, while two or more of them in the group described above may also be used it is practical to use one of them.

(19) A method of manufacturing a semiconductor integrated circuit according to (17) described above, wherein the sixth element is one of yttrium, hafnium, aluminum, zirconium, lanthanum, niobium, tantalum, titanium, scandium, and silicon. For the sixth element, while two or more of them in the group described above may also be used, it is practical to use one of them.

(20) A method of manufacturing a semiconductor integrated circuit device according to (17) described above wherein the oxidant is water, ozone, or hydrogen peroxide.

(21) A method of manufacturing a semiconductor integrated circuit device according to (17) described above wherein the content of the fifth element and the content of the sixth element in the deposited film are controlled by a ratio of a partial pressure of the fifth precursor and a partial pressure of the sixth precursor in a gas mixture of the fifth precursor and the sixth precursor exposed to the sample surface during deposition.

(22) A method of manufacturing a semiconductor integrated circuit device according to (21) described above wherein the fifth element is yttrium and the sixth element is hafnium.

(23) A method of manufacturing a semiconductor integrated circuit device according to (22) described above wherein a ratio of a partial pressure of the yttrium compound to a partial pressure of the hafnium compound in a gas mixture of the yttrium compound and the hafnium compound is 0.43. The ratio of the partial pressure of 0.43 is used within ±5%, more preferably, within ±3%.

(24) A method of manufacturing a semiconductor integrated circuit device according to (23) described above wherein the addition amount of yttrium in yttrium-stabilized hafnia is about 10% with respect to the atomic weight ratio.

(25) A method of manufacturing a semiconductor integrated circuit device having, formed above a semiconductor substrate, plurality of word lines, a plurality of bit lines, a memory selecting transistors each disposed on a predetermined intersection between the plurality of word lines and the plurality of bit lines, and a memory cell constituted with an information storing capacitors connected electrically in series with the selecting transistors and formed above the semiconductor substrate, in which the information storing capacitor comprises a lower electrode, an upper electrode, and an insulating film put between them, the insulating film comprises a seventh element, an eighth element, and oxygen, the insulating film is deposited by combining a fourth deposition cycle of exposing a seventh precursor containing the seventh element to the deposition surface and then exposing an oxidant containing oxygen to the deposition surface and a fifth deposition cycle of depositing the eighth element or an eighth oxide as an oxide of the eighth element, and substantially all adsorption sites on the deposition surface are replaced with the seventh precursor by exposing the seventh precursor to the deposition surface.

(26) A method of manufacturing a semiconductor integrated circuit according to (25) described above, wherein the seventh element is one of yttrium, hafnium, aluminum, zirconium, lanthanum, niobium, tantalum, titanium, scandium, and silicon.

(27) A method of manufacturing a semiconductor integrated circuit according to (25) described above, wherein the eighth element is one of yttrium, hafnium, aluminum, zirconium, lanthanum, niobium, tantalum, titanium, scandium, and silicon.

(28) A method of manufacturing a semiconductor integrated circuit according to (25) described above, wherein the eighth oxide is one of yttria, hafnia, alumina, zirconia, lanthanum trioxide, niobium pentoxide, tantalum pentoxide, titanium dioxide, scandium trioxide, and silicon dioxide.

(29) A method of manufacturing a semiconductor integrated circuit device according to (25) described above wherein the oxidant is water, ozone or hydrogen peroxide.

(30) A method of manufacturing a semiconductor integrated circuit device according to (25) described above wherein the thickness of the substance formed by the fourth deposition cycle and the thickness of a substance formed by the seventh deposition cycle are each less than 2 nm.

(31) A method of manufacturing a semiconductor integrated circuit device according to (25) described above wherein the thickness of the substance formed by the fourth deposition cycle and the thickness of a substance formed by the seventh deposition cycle are each 2 nm or more.

(32) A method of manufacturing a semiconductor integrated circuit device according to (25) described above wherein the content of the seventh element and the content of the eighth element in the deposited film are controlled by the ratio of the thickness of the material formed by the fourth deposition cycle and the thickness of the material formed by the seventh deposition cycle.

(33) A method of manufacturing a semiconductor integrated circuit device according to (32) described above wherein the seventh element is hafnium and the eighth element yttrium.

(34) A method of manufacturing a semiconductor integrated circuit device according to (33) described above wherein the ratio of the thickness of the substance formed by the fifth deposition cycle to the thickness of the material formed by the fourth deposition cycle is 0.29.

(35) A method of manufacturing a semiconductor integrated circuit device according (34) described above wherein the addition amount of yttrium in yttrium-stabilized hafnia is about 10% with respect to the atomic weight ratio.

Description of Reference Numerals
1 bit line,
2 silicon plug
3 silicon nitride film
4 silicon oxide film
5 titanium nitride film
6 insulating film
7 upper electrode
8 insulator layer
10 reaction chamber
11 temperature control device
12, 13, 14, 15 valve
16 hafnium compound precursor resource
17 yttrium compound precursor resource
18 oxide precursor
19 vacuum pump
20, 21, 22 valve
23 vacuum pump
24 aluminum compound precursor resource
30 introduction of hafnium compound precursor
31 purge of hafnium compound precursor
32 introduction of oxide
33 purge of oxide
34 introduction of yttrium compound precursor
35 purge of yttrium compound precursor
36 introduction of oxide
37 purge of oxide
40 introduction of hafnium compound precursor and yttrium compound precursor
41 purge of hafnium compound precursor and yttrium compound precursor
42 introduction of oxidant
43 purge of oxide (oxidant)
44, 45, 46, 47 valve
47, 49 mass flow controller
50 introduction of hafnium compound precursor
51 purge of hafnium compound precursor
52 introduction of oxide
53 purge of oxide
54 y deposition

What is claimed is:

1. A method of manufacturing a semiconductor integrated circuit device provided with a memory cell having an information storing capacitor formed above a semiconductor substrate, wherein
the information storing capacitor has a lower electrode, an upper electrode, and an insulating film disposed between the lower electrode and the upper electrode,
the insulating film comprises a first element, a second element, and oxygen,
the insulating film is deposited by a method of alternately exposing a first precursor as a compound containing the first element, a second precursor as a compound containing the second element and an oxidant containing oxygen to a deposition surface, and
an adsorption ratio of the first precursor to a plurality of adsorption sites on the deposition surface is less than 100% in the step of exposing the first precursor to the deposition surface, leaving remaining adsorption sites for the second precursor and the second precursor is adsorbed to the remaining adsorption sites for the second precursor in the step of exposing the second precursor to the deposition surface.

2. A method of manufacturing a semiconductor integrated circuit device provided with a memory cell having an information storing capacitor formed above a semiconductor substrate according to claim 1, wherein
the first element is at least one selected from a group consisting of yttrium, hafnium, aluminum, zirconium, lanthanum, niobium, tantalum, titanium, scandium and silicon, and
the second element is at least one selected from a group consisting of yttrium, hafnium, aluminum, zirconium, lanthanum, niobium, tantalum, titanium, scandium and silicon.

3. A method of manufacturing a semiconductor integrated circuit device provided with a memory cell having an information storing capacitor formed above a semiconductor substrate according to claim 1, wherein
the oxidant is water, ozone, or hydrogen peroxide.

4. A method of manufacturing a semiconductor integrated circuit device provided with a memory cell having an information storing capacitor formed above a semiconductor substrate according to claim 1, wherein
the content of the first element and the content of the second element in the deposited film are controlled by a replacement ratio on the adsorption sites of the deposition surface by the first precursor and the second precursor.

5. In a semiconductor integrated circuit device provided with a memory cell having an information storing capacitor formed above a semiconductor substrate, wherein the information storing capacitor has a lower electrode, an upper electrode, and an insulating film disposed between the lower electrode and the upper electrode, wherein the insulating film is formed by a method comprising the steps of:
exposing a first precursor, as a compound containing a first element, toward a deposition surface, the first precursor being adsorbed to a first plurality of adsorption sites on the deposition surface;
exposing a second precursor, as a compound containing a second element, toward the deposition surface, the second precursor being adsorbed to a second plurality of adsorption sites on the deposition surface that are different from the first plurality of adsorption sites; and
exposing an oxidant containing oxygen to the deposition surface, wherein the content of the first element and the content of the second element in the deposited film are controlled by a replacement ratio on the adsorption sites of the deposition surface by the first precursor and the second precursor.

6. A method of manufacturing a semiconductor integrated circuit device provided with a memory cell having an information storing capacitor formed above a semiconductor substrate according to claim 1, wherein the insulating film is deposited by method of alternately exposing the first precursor as the compound containing the first element, the second precursor as the compound containing the second element and the oxidant containing oxygen to the deposition surface, such that the first precursor is first introduced, then exposed and then purged, and thereafter the second precursor is introduced, then exposed and then purged, and thereafter the oxidant is introduced, then exposed and then purged.

* * * * *